United States Patent
Mayer et al.

(10) Patent No.: US 10,790,931 B2
(45) Date of Patent: Sep. 29, 2020

(54) REGENERATIVE PAYLOAD USING END-TO-END FEC PROTECTION

(71) Applicant: Fraunhofer-Gesellschaft zur Foerderung der angewandten Forschung e.V., Munich (DE)

(72) Inventors: Frank Mayer, Baiersdorf (DE); Leo Frank, Nuremberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 24 days.

(21) Appl. No.: 15/690,847

(22) Filed: Aug. 30, 2017

(65) Prior Publication Data
US 2018/0062788 A1  Mar. 1, 2018

(30) Foreign Application Priority Data
Aug. 30, 2016  (EP) ..................................... 16186389

(51) Int. Cl.
*H04L 1/00* (2006.01)
*H04B 7/185* (2006.01)
(Continued)

(52) U.S. Cl.
CPC ....... *H04L 1/0041* (2013.01); *H03M 13/1102* (2013.01); *H03M 13/152* (2013.01); *H03M 13/2906* (2013.01); *H03M 13/6502* (2013.01); *H04B 7/18513* (2013.01); *H04B 7/18515* (2013.01); *H04B 7/18521* (2013.01); *H04B 7/18523* (2013.01); *H04L 1/0053* (2013.01); *H04L 1/0065* (2013.01);
(Continued)

(58) Field of Classification Search
CPC ....................................................... H04L 1/0057
USPC ......................................... 714/776, 775, 774
See application file for complete search history.

(56) References Cited

U.S. PATENT DOCUMENTS 6,138,261 A * 10/2000 Wilcoxson ............ H03M 13/15
370/307
9,281,847 B2 * 3/2016 Stockhammer ..... H03M 13/373
(Continued)

OTHER PUBLICATIONS

Sandrin, W. A. et al., "System Architectures for Satellite Newsgathering", Comsat Technical Review, Communications Satellite Corporation vol. 24, No. 1/02 XP000635748, Jan. 1, 1994, 95-140.

*Primary Examiner* — Fritz Alphonse
(74) *Attorney, Agent, or Firm* — Perkins Coie LLP; Michael A. Glenn

(57) ABSTRACT

Disclosed herein is a transceiver for a satellite, where the transceiver includes a receiver, a digital data stream processor and at least one transmitter. The receiver is configured to receive an uplink data stream from a satellite gateway or another satellite where the data stream carries a plurality of data packets. The digital data stream processor is configured to process the uplink data stream, to obtain the plurality of data packets, where at least one of the data packets includes payload data and error correcting data allowing a full error correction of the payload data. The data stream processor is further configured to perform no or only a partial error correction of the payload data of the at least one data packet, to obtain a downlink data stream. The transmitter is configured to transmit the downlink data stream to user terminal or another satellite.

14 Claims, 15 Drawing Sheets

(51) Int. Cl.
*H03M 13/00* (2006.01)
*H03M 13/15* (2006.01)
*H03M 13/11* (2006.01)
*H03M 13/29* (2006.01)
*H04W 72/12* (2009.01)

(52) U.S. Cl.
CPC .... *H03M 13/2927* (2013.01); *H04W 72/1268* (2013.01); *H04W 72/1273* (2013.01)

(56) References Cited

U.S. PATENT DOCUMENTS

| | | | |
|---|---|---|---|
| 2008/0167031 A1* | 7/2008 | Sorber | H04B 7/18523 455/426.1 |
| 2012/0233518 A1 | 9/2012 | Lee et al. | |
| 2015/0351116 A1* | 12/2015 | Shoshan | H04B 7/15542 370/330 |
| 2016/0049964 A1 | 2/2016 | Mateosky et al. | |

* cited by examiner

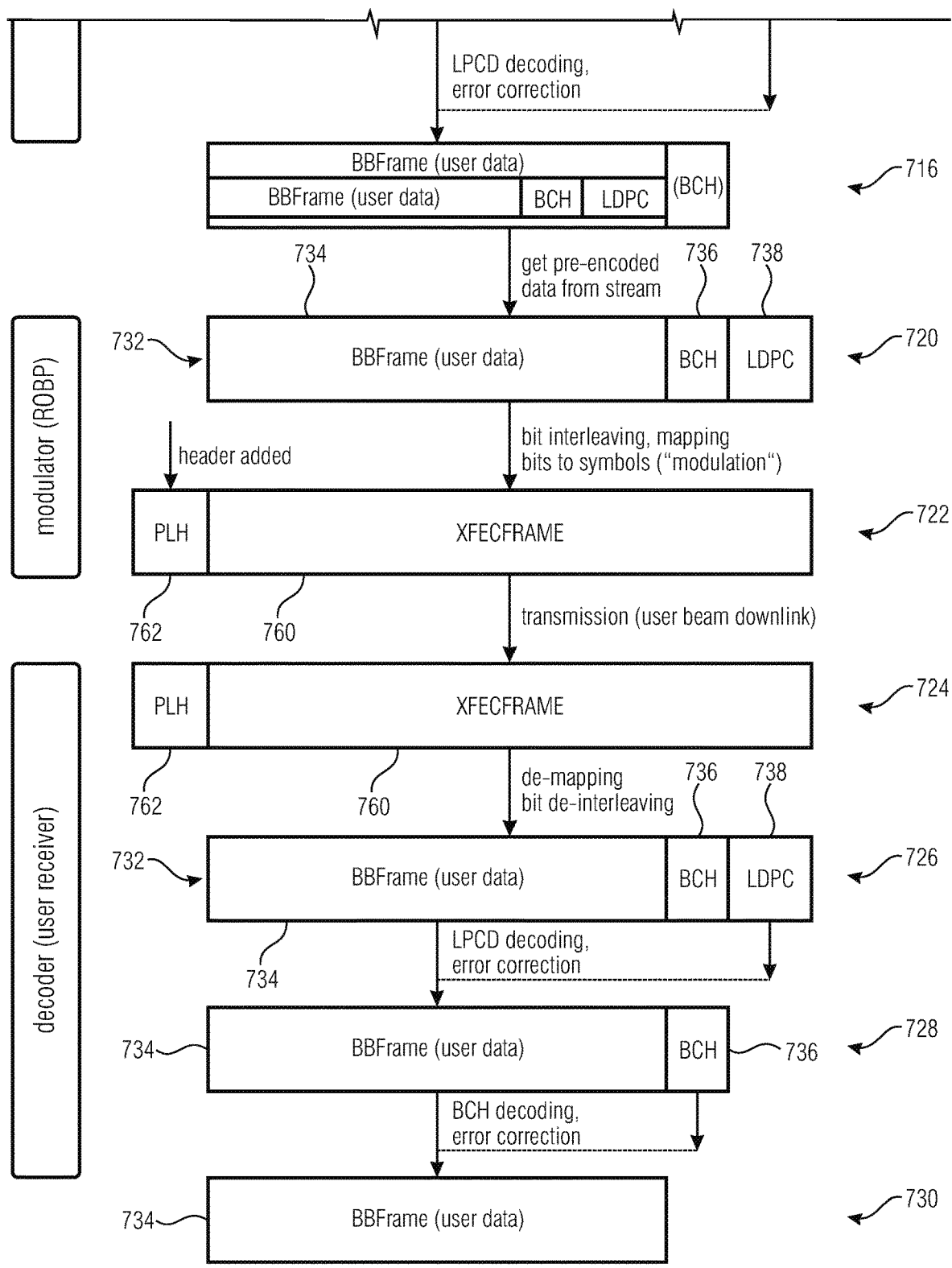

REGENERATIVE PAYLOAD USING END-TO-END FEC PROTECTION

CROSS-REFERENCE TO RELATED APPLICATIONS

This application claims priority from European Patent Application No. EP16186389.9, which was filed on Aug. 30, 2016, and is incorporated herein in its entirety by reference.

Embodiments relate to a transceiver for a satellite. Further embodiments relate to transmitter for a satellite gateway. Some embodiments relate to a satellite system (e.g., satellite gateway—satellite system/inter-satellite system) using a regenerative payload with end-to-end FEC (FEC=forward error correction) protection.

BACKGROUND OF THE INVENTION

Satellite communication may be used, among other applications, for direct-to-home TV broadcast or for satellite broadband (internet access using satellite). The technical infrastructure for the "forward link" comprises a gateways station, up-linking a radio frequency (RF) signal to the satellite; a satellite receiving this signal using an antenna directed towards the gateway, amplifying, filtering and frequency converting the signal, and then re-transmitting (down-linking) the signal using an antenna directed towards the end user region ("user beam"). This second RF signal is then received by the user terminal, amplified, frequency converted, de-modulated and output, e.g. as a digital video stream, for video playback in a TV set, or as an IP (IP=internet protocol) stream, for use by computer and IP-capable equipment. Bi-directional communication, e.g. as used in satellite broadband applications implements an additional "return link", from the user terminal to the gateway, with the satellite receiving the RF signal up-linked by the user terminal through the antenna directed towards the end user region, amplifies, frequency converts, filters and combines the signal with signals from other users and then re-transmits (down-links) the signal using an antenna directed towards the gateway station.

Both the up- and downlink are bridging a considerable distance between earth surface and satellite (e.g. in GEO (GEO=geostationary earth orbit) orbit, approx. 36000 km above ground) and thus are impaired by thermal background noise and by noise generated in the electronic equipment (e.g. amplifiers, filters, mixer) itself. Furthermore, the link is impaired by different types of interference, e.g. resulting from other terrestrial or space-borne transmissions picked up by the antenna or by intermodulation products and spurious signals generated in electronic components (mixer, high power amplifier). This, together with the finite power of the ground and space based amplifiers and antenna sizes, limits the signal-to-noise ratio of each up- and downlink. The limited signal-to-noise ratio limits the maximum spectral efficiency of the link, and this, together with the amount of spectrum available for the system, sets the maximum capacity of the link and the system.

The most commonly used satellite payload architecture is the so called "bent pipe" architecture. In this architecture, the received signal is amplified and frequency converted using analogue means. If a gateway feeds multiple user beams, this it done using a frequency-multiplex signal and filtering (channelization) and routing the respective sub-bands to the antennas pointing toward the different user beams. Such a "bent pipe" payload typically implements no means for interference cancellation, therefore the noise and interference from the up-link and the down-link signal aggregate.

An extension of this analogue "bent pipe" architecture is disclosed in US 2012/094593 A. Compared to the standard "bent pipe" architecture, a two-stage frequency down- and up-conversion process is used. This allows to carry out the analogue signal processing (e.g. signal aggregation) at a third, advantageously low intermediate frequency.

A more recent approach is to implement the "bent pipe" architecture using digital instead of analogue signal processing means. Such an implementation is disclosed in US 2003/134592 A, consisting of an input section (amplification, frequency down-conversion, analogue to digital conversion), a digital payload "processor" and an output section (analogue to digital conversion, frequency up-conversion, high power amplifier). The digital payload "processor" provides filtering means for channelization and optionally switching means for selectively feeding the information into different output paths and user beams.

Concepts for a digital payload with additional switching or routing capability are disclosed in U.S. Pat. No. 4,931,802 A, EP 2 112 773 A1 and U.S. Pat. No. 7,675,985 B.

Concepts for a digital payload with focus on a scalable architecture are disclosed in US 2011/110401 A and WO 16034883 A1.

While digital "bent pipe" type payloads may reduce impairments introduced by the analog processing, the noise and interference from the up-link and the down-link signal still aggregates. To mitigate this issue, so called "regenerative payloads" are known. The "regenerative" process consists of de-modulating the received signal into a digital bit or packet stream and to re-modulate the digital bit stream for transmission. Such regenerative concepts are disclosed in US 2009/323583 A and as option in US 2004/185775 A and US 2014/092804 A. FIG. 1 in US 2009/323583 A shows the block diagram of the regenerative processing. Block 20, labeled "FEC Decoder" performs forward error correction (FEC) decoding and will—as long as the up-link carrier to noise and interference ratio meets or exceeds the capabilities of the FEC scheme—recover a quasi-error free digital bit stream. Re-encoding this quasi-error free bit stream prior to modulation provides independent protection on the up- and downlink, with up-link and down-link noise and interference no longer aggregating.

Besides de-coupling up- and downlink, the regenerative approach has various benefits, e.g. allows translation between different data formats, as disclosed in U.S. Pat. No. 6,574,794 B for encapsulating "individual received service-program data into MPEG transport streams, and broadcasting these in a DVB-compatible format via full-area broadcast beams.", or for packet switching and IP routing as disclosed in U.S. Pat. No. 6,628,919 B or U.S. Pat. No. 6,724,737 B.

Depending on FEC scheme, decoding and error correction is a processing and memory intensive process and thus limited by available payload resources (power, mass). To more efficiently use such resources, U.S. Pat. No. 6,252,917 B discloses a decoder limiting the number of iterations based on the estimated received signal quality. US 2001/005671 A discloses an alternative concept with a limited number of demodulators that are adaptively connected, based on data loading.

SUMMARY

According to an embodiment, a satellite may have: a receiver configured to receive an uplink data stream, the data stream carrying a plurality of data packets; a digital data stream processor, configured to process the uplink data stream, to obtain the plurality of data packets, wherein at least one of the data packets includes payload data and error correcting data allowing a full error correction of the payload data, wherein the data stream processor is configured to perform no or only a partial error correction of the payload data of the at least one data packet, to obtain a downlink data stream; and at least one transmitter configured to transmit the downlink data stream.

According to another embodiment, a satellite gateway may have: a pre-encoder, configured to encode payload data to obtain error correcting data for the payload data, and to provide a pre-encoded data packet including the payload data and the error correcting data for the payload data; an encoder configured to encode the pre-encoded data packet to obtain error correcting data for the pre-encoded data packet, and to provide a data packet including the pre-encoded data packet as payload data and the error correcting data for the pre-encoded data packet; and a transmitter, configured to transmit an uplink data stream including the data packet to a satellite.

According to another embodiment, a satellite may have: a receiver configured to receive an uplink data stream, the data stream carrying a plurality of data packets; a digital data stream processor, configured to demodulate the uplink data stream, to obtain the plurality of data packets, wherein the data stream processor is configured to decode and error correct at least one of the data packets using error correcting data contained in the data packet, to obtain as decoded and error corrected payload data a pre-encoded data packet including payload data and error correcting data for the payload data; wherein the digital data stream processor is configured to modulate the pre-encoded data packet including the payload data and the error correcting data for the payload data, to obtain a downlink data stream; and at least one transmitter configured to transmit the downlink data stream.

According to another embodiment, a system may have: an inventive satellite gateway; and a satellite, having: a receiver configured to receive an uplink data stream, the data stream carrying a plurality of data packets; a digital data stream processor, configured to demodulate the uplink data stream, to obtain the plurality of data packets, wherein the data stream processor is configured to decode and error correct at least one of the data packets using error correcting data contained in the data packet, to obtain as decoded and error corrected payload data a pre-encoded data packet including payload data and error correcting data for the payload data; wherein the digital data stream processor is configured to modulate the pre-encoded data packet including the payload data and the error correcting data for the payload data, to obtain a downlink data stream; and at least one transmitter configured to transmit the downlink data stream.

According to another embodiment, an inter-satellite system may have two satellites, one satellite having: a receiver configured to receive an uplink data stream, the data stream carrying a plurality of data packets; a digital data stream processor, configured to process the uplink data stream, to obtain the plurality of data packets, wherein at least one of the data packets includes payload data and error correcting data allowing a full error correction of the payload data, wherein the data stream processor is configured to perform no or only a partial error correction of the payload data of the at least one data packet, to obtain a downlink data stream; and at least one transmitter configured to transmit the downlink data stream; and the satellite wherein the digital data stream processor is configured to leave the payload data and the error correcting data for the payload data of the pre-encoded data packet unaltered, such that the downlink data stream includes the pre-encoded data packet with the payload data and the error correcting data as decoded and error corrected.

According to another embodiment, a transceiver may have: a receiver configured to receive an uplink data stream, the data stream carrying a plurality of data packets; a digital data stream processor, configured to process the uplink data stream, to obtain the plurality of data packets, wherein at least one of the data packets includes payload data and error correcting data allowing a full error correction of the payload data, wherein the data stream processor is configured to perform no or only a partial error correction of the payload data of the at least one data packet, to obtain a downlink data stream; and at least one transmitter configured to transmit the downlink data stream to a user terminal.

According to another embodiment, a transceiver may have: a receiver configured to receive an uplink data stream, the data stream carrying a plurality of data packets; a digital data stream processor, configured to demodulate the uplink data stream, to obtain the plurality of data packets, wherein the data stream processor is configured to decode and error correct at least one of the data packets using error correcting data contained in the data packet, to obtain as decoded and error corrected payload data a pre-encoded data packet including payload data and error correcting data for the payload data; wherein the digital data stream processor is configured to modulate the pre-encoded data packet including the payload data and the error correcting data for the payload data, to obtain a downlink data stream; and at least one transmitter configured to transmit the downlink data stream.

According to another embodiment, a method may have the steps of: receiving an uplink data stream, the data stream carrying a plurality of data packets; processing the uplink data stream, to obtain the plurality of data packets, wherein at least one of the data packets includes payload data and error correcting data allowing a full error correction of the payload data; perform no or only a partial error correction of the payload data of the at least one data packet, to obtain a downlink data stream; and transmitting the downlink data stream.

According to another embodiment, a method may have the steps of: encoding payload data to obtain error correcting data for the payload data; providing a pre-encoded data packet including the payload data and the error correcting data for the payload data; encoding the pre-encoded data packet to obtain error correcting data for the pre-encoded data packet; providing a data packet including the pre-encoded data packet and the error correcting data for the pre-encoded data packet; and transmitting an uplink data stream including the data packet.

According to another embodiment, a method may have the steps of: receiving an uplink data stream, the data stream carrying a plurality of data packets; demodulating the uplink data stream, to obtain the plurality of data packets; decoding and error correcting at least one of the data packets using error correcting data contained in the data packet, to obtain as decoded and error corrected payload data a pre-encoded data packet including payload data and error correcting data for the payload data; modulating the pre-encoded data packet including the payload data and the error correcting data for the payload data, to obtain a downlink data stream; and transmitting the downlink data stream.

Another embodiment may have a non-transitory digital storage medium having a computer program stored thereon to perform the method, the method having the steps of: receiving an uplink data stream, the data stream carrying a plurality of data packets; processing the uplink data stream, to obtain the plurality of data packets, wherein at least one of the data packets includes payload data and error correcting data allowing a full error correction of the payload data; perform no or only a partial error correction of the payload data of the at least one data packet, to obtain a downlink data stream; and transmitting the downlink data stream, when said computer program is run by a computer.

Another embodiment may have a non-transitory digital storage medium having a computer program stored thereon to perform the method, the method having the steps of: encoding payload data to obtain error correcting data for the payload data; providing a pre-encoded data packet including the payload data and the error correcting data for the payload data; encoding the pre-encoded data packet to obtain error correcting data for the pre-encoded data packet; providing a data packet including the pre-encoded data packet and the error correcting data for the pre-encoded data packet; and transmitting an uplink data stream including the data packet, when said computer program is run by a computer.

Another embodiment may have non-transitory digital storage medium having a computer program stored thereon to perform the method, the method having the steps of: receiving an uplink data stream, the data stream carrying a plurality of data packets; demodulating the uplink data stream, to obtain the plurality of data packets; decoding and error correcting at least one of the data packets using error correcting data contained in the data packet, to obtain as decoded and error corrected payload data a pre-encoded data packet including payload data and error correcting data for the payload data; modulating the pre-encoded data packet including the payload data and the error correcting data for the payload data, to obtain a downlink data stream; and transmitting the downlink data stream, when said computer program is run by a computer.

Embodiments provide a transceiver for a satellite (or a satellite with the transceiver), the transceiver comprising a receiver, a digital data stream processor and at least one transmitter. The receiver is configured to receive an uplink data stream from a satellite gateway or another satellite, the data stream carrying a plurality of data packets. The digital data stream processor is configured to process the uplink data stream, to obtain the plurality of data packets, wherein at least one of the data packets comprises payload data and error correcting data allowing a full error correction of the payload data, wherein the data stream processor is configured to perform no or only a partial error correction of the payload data of the at least one data packet, to obtain a downlink data stream. The at least one transmitter is configured to transmit the downlink data stream to a user terminal or another satellite.

Embodiments provide a transceiver for a satellite (or a satellite comprising the transceiver), the transceiver comprising a receiver, a digital data stream processor and at least one transmitter. The receiver is configured to receive an uplink data stream from a satellite gateway or another satellite, the data stream carrying a plurality of data packets. The digital data stream processor is configured to demodulate the uplink data stream, to obtain the plurality of data packets, wherein the data stream processor is configured to decode and error correct at least one of the data packets using error correcting data contained in the data packet, to obtain as decoded and error corrected payload data a pre-encoded data packet comprising payload data and error correcting data for the payload data. The digital data stream processor is configured to modulate the pre-encoded data packet comprising the payload data and the error correcting data for the payload data, to obtain a downlink data stream. The at least one transmitter is configured to transmit the downlink data stream to a user terminal or another satellite.

According to the concept of the present invention, the involved computing power of a transceiver of a satellite can be reduced while maintaining the error correcting capabilities of the satellite communication system, (1) by performing only a partial error correction of the payload data of the data packet received and retransmitted without re-encoding by the transceiver of the satellite, the retransmitted data packet containing a non-used part of the error correcting data of the payload data such that a receiver of the satellite communication system can perform a remaining error correction of the payload data using the non-used part of the error correcting data, or (2) by performing a (full) error correction of the payload data of the data packet, to obtain a pre-encoded data packet that already contains error correction data, the pre-encoded data packet being re-transmitted without re-encoding such that a receiver satellite communication system can perform an error correction of the pre-encoded data packet using pre-encoded error correction data contained in the pre-encoded data packet.

Further embodiments provide a satellite gateway, comprising a pre-encoder, an encoder and a transmitter. The pre-encoder is configured to encode payload data to obtain error correcting data for the payload data, and to provide a pre-encoded data packet comprising the payload data and the error correcting data for the payload data. The encoder is configured to encode the pre-encoded data packet to obtain error correcting data for the pre-encoded data packet, and to provide a data packet comprising the pre-encoded data packet and the error correcting data for the pre-encoded data packet. The transmitter is configured to transmit an uplink data stream comprising the data packet to a satellite.

Further embodiments provide a transceiver comprising a receiver, a digital data stream processor and at least one transmitter. The receiver is configured to receive an uplink data stream, the data stream carrying a plurality of data packets. The digital data stream processor is configured to process the uplink data stream, to obtain the plurality of data packets, wherein at least one of the data packets comprises payload data and error correcting data allowing a full error correction of the payload data, wherein the data stream processor is configured to perform no or only a partial error correction of the payload data of the at least one data packet, to obtain a downlink data stream. The at least one transmitter is configured to transmit the downlink data stream to a user terminal.

Further embodiments provide a transceiver comprising a receiver, a digital data stream processor and at least one transmitter. The receiver is configured to receive an uplink data stream, the data stream carrying a plurality of data packets. The digital data stream processor is configured to demodulate the uplink data stream, to obtain the plurality of data packets, wherein the data stream processor is configured to decode and error correct at least one of the data packets using error correcting data contained in the data packet, to obtain as decoded and error corrected payload data a pre-encoded data packet comprising payload data and error correcting data for the payload data. The digital data stream processor is configured to modulate the pre-encoded data packet comprising the payload data and the error correcting data for the payload data, to obtain a downlink data stream. The at least one transmitter configured to transmit the downlink data stream.

Further embodiments provide a method, the method comprising:
  receiving an uplink data stream, the data stream carrying a plurality of data packets;
  processing the uplink data stream, to obtain the plurality of data packets, wherein at least one of the data packets comprises payload data and error correcting data allowing a full error correction of the payload data;
  performing no or only a partial error correction of the payload data of the at least one data packet, to obtain a downlink data stream; and
  transmitting the downlink data stream.

Further embodiments provide a method, the method comprising:
  encoding payload data to obtain error correcting data for the payload data;
  providing a pre-encoded data packet comprising the payload data and the error correcting data for the payload data;
  encoding the pre-encoded data packet to obtain error correcting data for the pre-encoded data packet;
  providing a data packet comprising the pre-encoded data packet and the error correcting data for the pre-encoded data packet; and
  transmitting an uplink data stream comprising the data packet.

Further embodiments provide a method, the method comprising:
  receiving an uplink data stream, the data stream carrying a plurality of data packets;
  demodulating the uplink data stream, to obtain the plurality of data packets;
  decoding and error correcting at least one of the data packets using error correcting data contained in the data packet, to obtain as decoded and error corrected payload data a pre-encoded data packet comprising payload data and error correcting data for the payload data;
  modulating the pre-encoded data packet comprising the payload data and the error correcting data for the payload data, to obtain a downlink data stream; and
  transmitting the downlink data stream.

Subsequently, advantageous implementations of the transceiver are described, that comprises the digital data stream processor configured to process the uplink data stream, to obtain the plurality of data packets, at least one of the data packets comprising payload data and error correcting data allowing a full error correction of the payload data, the data stream processor being configured to perform no or only a partial error correction of the payload data of the at least one data packet, to obtain the downlink data stream.

In embodiments, the error correcting data of the data packet can comprise two different error correcting code words corresponding to two different error correcting codes. In that case, the digital data stream processor can be configured to partially error correct the payload data using only one of the two different error correcting code words (e.g., only a first code word of the at least two different code words).

In other words, the digital data stream processor can be configured to use one of the at least two different code words for partially error correcting the payload data and to not use the other one of the at least two different code words for error correcting the payload data.

Further, the digital data stream processor can be configured to leave the other one of the two different error correcting code words unaltered (e.g., the second code word of the at least two different code words).

Furthermore, the digital data stream processor can be configured to provide the downlink data stream comprising the at least one data packet, the at least one data packet comprising the error corrected payload data (error corrected with only one of the two different error correcting code words) and the other one of the at least two different error correcting code words as received (i.e., as is) or as received and error corrected with only one of the two different error correcting words.

For example, the error correcting data can comprise a BCH (BCH=Bose-Chaudhuri-Hocquenghem) code word and a LDPC (LPDC=Low-Density-Parity-Check) code word. The LDPC code word (or checksum) can be the inner code word and be used for correcting uplink errors. The BCH code word (or checksum) (e.g., generated over the original payload (e.g., at a transmitter side (e.g., satellite gateway side)) can be re-transmitted as is (i.e., as received or as received and corrected using the LDPC code word). A receiver of the satellite communication system (e.g., a user terminal) may use the LPDC code word again for correcting (most) downlink errors, while using (afterwards) the BCH code word for correcting remaining errors (e.g., not corrected with the LDPC code word).

In embodiments, the digital data stream processor can be configured to modify the at least one of the data packets, to obtain a modified version of the at least one of the data packets, and to provide the downlink data stream having the modified version of the at least one of the data packets.

For example, the digital data stream processor can be configured to modify the at least one of the data packets according to requirements or specifications of a downlink communication channel (e.g., downlink satellite beam). In other words, the digital data stream processor can be configured to modify the at least one of the data packets such that the at least one of the data packets or the downlink data stream comprising the at least one of the data packets fulfills requirements or specifications of a downlink communication channel (e.g., downlink satellite beam).

The digital data stream processor can be configured to modify a modulation of the at least one of the data packets. In detail, the digital data stream processor can be configured to demodulate the uplink data stream modulated with a first modulation, to obtain the plurality of data packets, wherein the digital data stream processor can be configured to modulate at least one of the data packets, to obtain a downlink data stream modulated with a second modulation different from the first modulation.

The digital data stream processor can be configured to modify a code rate of the at least one of the data packets. In detail, the digital data stream processor can be configured to process the uplink data stream to obtain the plurality of data packets, at least one of the data packets having a first code rate, wherein the digital data stream processor can be configured to modify the code rate of the at least one data packet, to obtain a downlink data stream comprising the at least one of the data packets having a second code rate different from the first code rate.

The digital data stream processor can be configured to modify the at least one of the data packets by modifying an error correction coding of the at least one of the data packets (e.g., with respect to a number of redundancy bits).

The digital data stream processor can be configured to modify the at least one of the data packets by puncturing the data packet (e.g., puncturing at least one out of payload data and error correcting data), for example, to selectively remove data to adjust redundancy as needed for the downlink.

The digital data stream processor can be configured to modify the at least one of the data packets by adding at least one out of header data, tail data and pilot data to the at least one of the data packets.

For example, the digital data stream processor can be configured to selectively remove parts of at least one out of payload data and error protecting (correcting) data, reducing the amount of redundancy in the data packet, to match the requirements for the downlink (e.g. low redundancy for good link, keep most or all redundancy for bad link). This may be combined with other modifications as described above, for example, scrambling the payload and/or error protecting data, insert header, tail and pilot data.

In embodiments, the digital data stream processor can be configured to modify at least one data packet corresponding to a first satellite beam, to obtain a first downlink data stream, and to modify at least one data packet corresponding to a second satellite beam, to obtain a second downlink data stream. Thereby, the digital data processor can be configured to provide the first downlink stream to a first transmitter corresponding to the first satellite beam and to provide the second downlink beam to a second transmitter corresponding to the second satellite beam.

For example, the digital data stream processor can be configured to modify the at least one of the data packets corresponding to the first satellite beam according to requirements or specifications of the first satellite beam, and to modify the at least one of the data packets corresponding to the second satellite beam according to requirements or specifications of the second satellite beam.

The digital data stream processor can be configured to modify a modulation of the at least one of the data packets corresponding to the first satellite beam and to modify a modulation of the at least one of the data packets corresponding to the second satellite beam.

The digital data stream processor can be configured to modify a code rate of the at least one of the data packets corresponding to the first satellite beam and to modify a code rate of the at least one of the data packets corresponding to the second satellite beam.

In embodiments, the digital data stream processor can be configured to not decode or error correct the at least one of the data packets.

Subsequently, advantageous implementations of the transceiver are described, that comprises the digital data stream processor configured to demodulate the uplink data stream, to obtain the plurality of data packets, and to error correct at least one of the data packets using the error correcting data contained in the data packet, to obtain as decoded and error corrected payload data the pre-encoded data packet comprising payload data and error correcting data for the payload data, and to modulate the pre-encoded data packet comprising the payload data and the error correcting data for the payload data, to obtain the downlink data stream.

In embodiments, the digital data stream processor can be configured to leave the payload data and the error correcting data for the payload data of the pre-encoded data packet unaltered, such that the downlink data stream comprises the pre-encoded data packet with the payload data and the error correcting data as decoded and error corrected.

In embodiments, the data stream processor can be configured to modify the at least one of the pre-encoded data packets, to obtain a modified version of the at least one of the pre-encoded data packets, and to provide the downlink data stream having the modified version of the at least one of the pre-encoded data packets.

For example, the digital data stream processor can be configured to modify the pre-encoded data packet according to requirements or specifications of a downlink communication channel (e.g., downlink satellite beam). In other words, the digital data stream processor can be configured to modify the pre-encoded data packet such that the pre-encoded data packet or the downlink data stream comprising the pre-encoded data packet fulfills requirements or specifications of a downlink communication channel (e.g., downlink satellite beam).

The digital data stream processor can be configured to modify a modulation of the pre-encoded data packet. In detail, the digital data stream processor can be configured to demodulate the uplink data stream modulated with a first modulation, and to modulate the pre-encoded data packet, to obtain a downlink data stream modulated with a second modulation different from the first modulation.

The digital data stream processor can be configured to modify a code rate of the pre-encoded data packet. In detail, the digital data stream processor can be configured to process the uplink data stream to obtain the plurality of data packets, at least one of the data packets having a first code rate, wherein the digital data stream processor can be configured to modify the code rate of the pre-encoded data packet, to obtain a downlink data stream comprising the pre-encoded data packet having a second code rate different from the first code rate.

The digital data stream processor can be configured to modify the pre-encoded data packet by modifying an error correction coding of the pre-encoded data packet (e.g., with respect to a number of redundancy bits.

The digital data stream processor can be configured to modify the pre-encoded data packet by puncturing the pre-encoded data packet (e.g., puncturing at least one out of payload data and error correcting data), for example, to selectively remove data to adjust redundancy as needed for the downlink.

The digital data stream processor can be configured to modify the pre-encoded data packet by adding at least one out of header data, tail data and pilot data to the pre-encoded data packet.

For example, the digital data stream processor can be configured to selectively remove parts of at least one out of payload data and error protecting (correcting) data of the pre-encoded data packet, reducing the amount of redundancy in the pre-encoded data packet, to match the requirements for the downlink (e.g. low redundancy for good link, keep most or all redundancy for bad link). This may be combined with other modifications as described above, for example, scrambling the payload and/or error protecting data, insert header, tail and pilot data.

In embodiments, the digital data stream processor can be configured to perform a two-stage decoding and error correction of the at least one of the data packets using the error correcting data contained in the data packet to obtain as the decoded and error corrected payload data the pre-encoded data packet, the error correcting data comprising two different code words corresponding to two different error correcting codes.

The error correcting data of the at least one of the data packets can comprise a BCH (BCH=Bose-Chaudhuri-Hocquenghem) code word and a LDPC (LPDC=Low-Density-Parity-Check) code word. The BCH code word (or checksum) can be generated over the original payload, i.e. the pre-encoded data packet (e.g., at a transmitter side (e.g., satellite gateway side)). The LDPC code word (or checksum) can be generated over the original payload and the BCH code word (e.g., at a transmitter side (e.g., satellite gateway side)).

The error correcting data of the pre-encoded data packet can comprise a BCH (BCH=Bose-Chaudhuri-Hocquenghem) code word and a LDPC (LPDC=Low-Density-Parity-Check) code word. The BCH code word (or checksum) can be generated over the original payload (e.g., at a transmitter side (e.g., satellite gateway side)). The LDPC code word (or checksum) can be generated over the original payload and the BCH code word (e.g., at a transmitter side (e.g., satellite gateway side)).

Subsequently, advantageous implementations of the satellite gateway are described.

In embodiments, the pre-encoder can be configured to encode the payload data twice using two different error correcting codes, to obtain the error correcting data for the payload data, the error correcting data comprising two different error correcting code words corresponding to the two different error correcting codes.

For example, the error correcting data of the pre-encoded data packet can comprise a BCH (BCH=Bose-Chaudhuri-Hocquenghem) code word and a LDPC (LPDC=Low-Density-Parity-Check) code word.

The pre-encoder can be configured to generate the BCH code word (or checksum) over the original payload.

The pre-encoder can be configured to generate the LDPC code word (or checksum) over the original payload and the BCH code word.

In embodiments, the encoder can be configured to encode the pre-encoded data packet twice using two different error correcting codes, to obtain the error protecting data for the pre-encoded data packet, the error protecting data comprising two different error correcting code words corresponding to the two different error correcting codes.

For example, the error correcting data of the data packet can comprise a BCH (BCH=Bose-Chaudhuri-Hocquenghem) code word and a LDPC (LPDC=Low-Density-Parity-Check) code word.

The encoder can be configured to generate the BCH code word (or checksum) over the pre-encoded data packet.

The encoder can be configured to generate the LDPC code word (or checksum) over the pre-encoded data packet and the BCH code word.

BRIEF DESCRIPTION OF THE DRAWINGS

Embodiments of the present invention will be detailed subsequently referring to the appended drawings, in which:

FIGS. 7a-b shows a flowchart of data transmission method in a satellite communication system, according to a third embodiment;

DETAILED DESCRIPTION OF THE INVENTION

Figure 1:
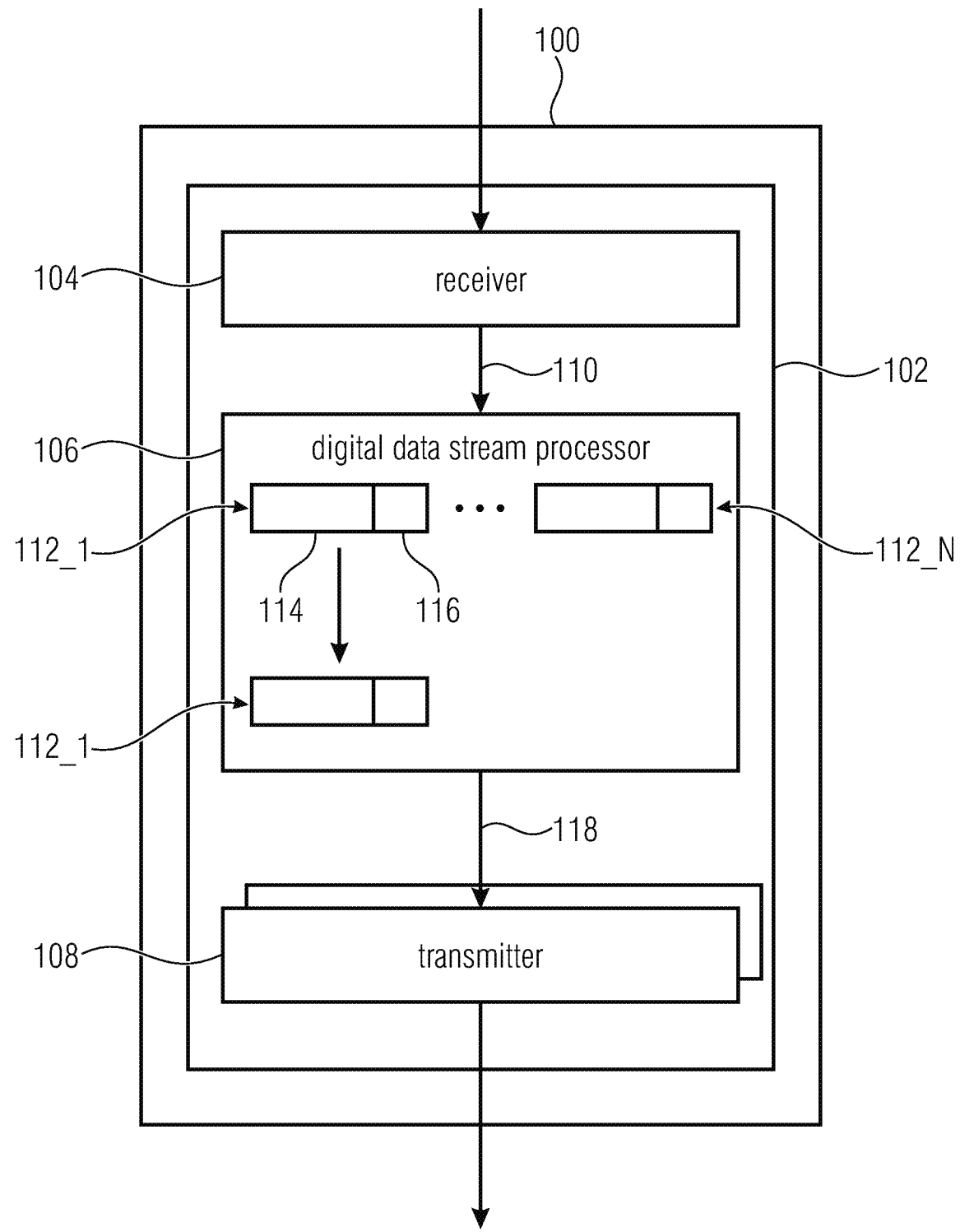
FIG. 1 shows a schematic block diagram of a transceiver of a satellite, according to an embodiment of the present invention.

Equal or equivalent elements or elements with equal or equivalent functionality are denoted in the following description by equal or equivalent reference numerals.

In the following description, a plurality of details is set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a schematic block diagram of a transceiver 102 of a satellite 100, according to an embodiment of the present invention. The transceiver 102 comprises a receiver 104, a digital data stream processor 106 and at least one transmitter 108. The receiver 104 is configured to receive an uplink data stream, the data stream carrying a plurality of data packets 112_1 to 112_N. The digital data stream processor 106 is configured to process the uplink data stream 110, to obtain the plurality of data packets 112, wherein at least one of the data packets 112_1 comprises payload data 114 and error correcting data 116 allowing a full error correction of the payload data 114, wherein the data stream processor 106 is configured to perform no or only a partial error correction of the payload data 114 of the at least one data packet 112_1, to obtain a downlink data stream 118. The at least one transmitter 108 is configured to transmit the downlink data stream.

Figure 2:
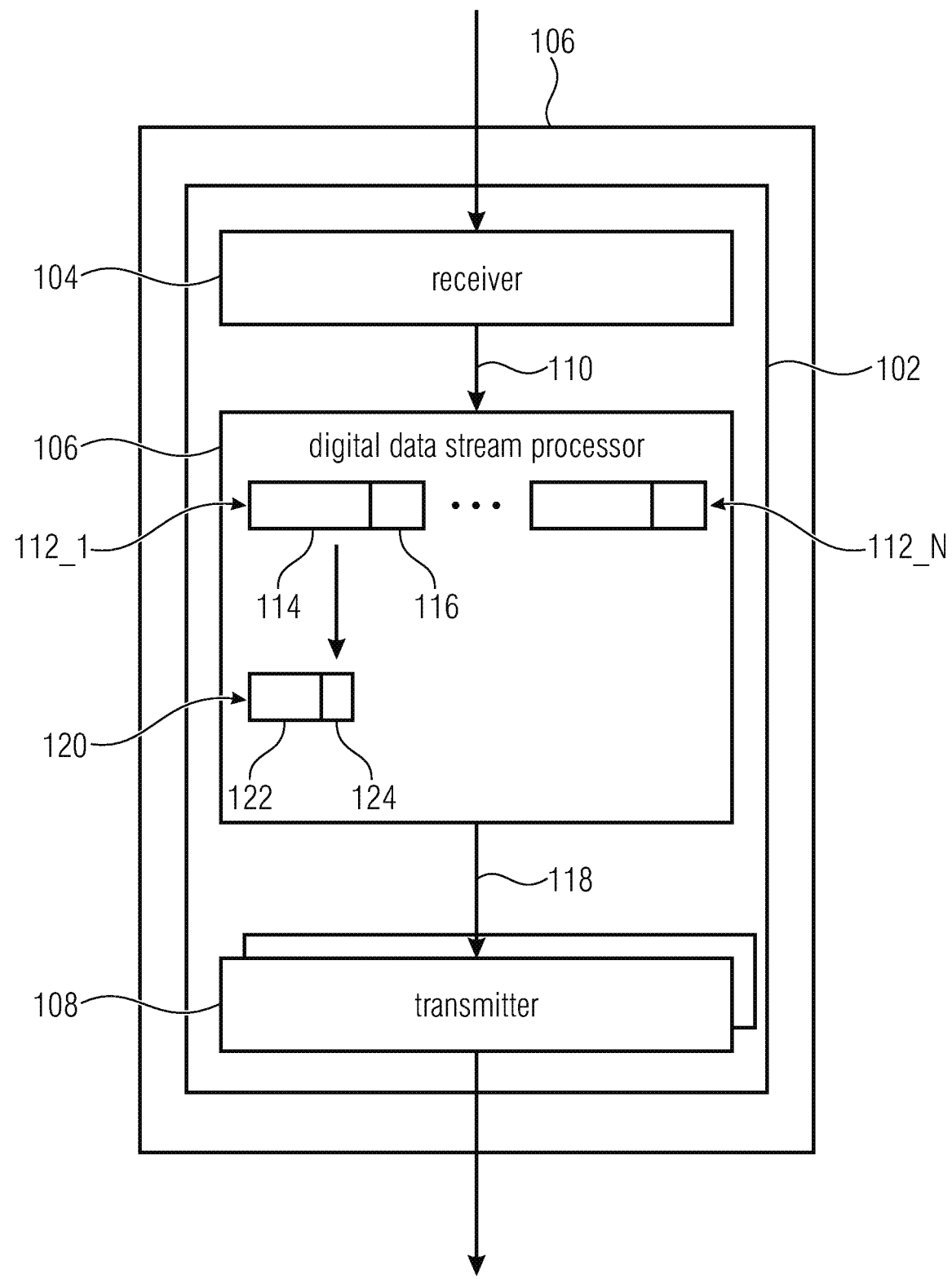
FIG. 2 shows a schematic block diagram of a transceiver of a satellite, according to an embodiment of the present invention.

FIG. 2 shows a schematic block diagram of a transceiver 102 of a satellite 100, according to an embodiment of the present invention. The transceiver 102 comprises a receiver 104, a digital data stream processor 106 and at least one transmitter 108. The receiver 104 is configured to receive an uplink data stream, the data stream carrying a plurality of data packets 112_1 to 112_N. The digital data stream processor 106 is configured to demodulate the uplink data stream 110, to obtain the plurality of data packets 112_1 to 112_N, wherein the data stream processor 106 is configured to decode and error correct at least one of the data packets 112_1 using error correcting data 116 contained in the data packet 112_1, to obtain as decoded and error corrected payload data 114 a pre-encoded data packet 120 comprising payload data 122 and error correcting data 124 for the payload data 122. The digital data stream processor 106 is configured to modulate the pre-encoded data packet 120 comprising the payload data 122 and the error correcting data 124 for the payload data 122, to obtain a downlink data stream 118. The at least one transmitter 108 is configured to transmit the downlink data stream.

Figure 3:
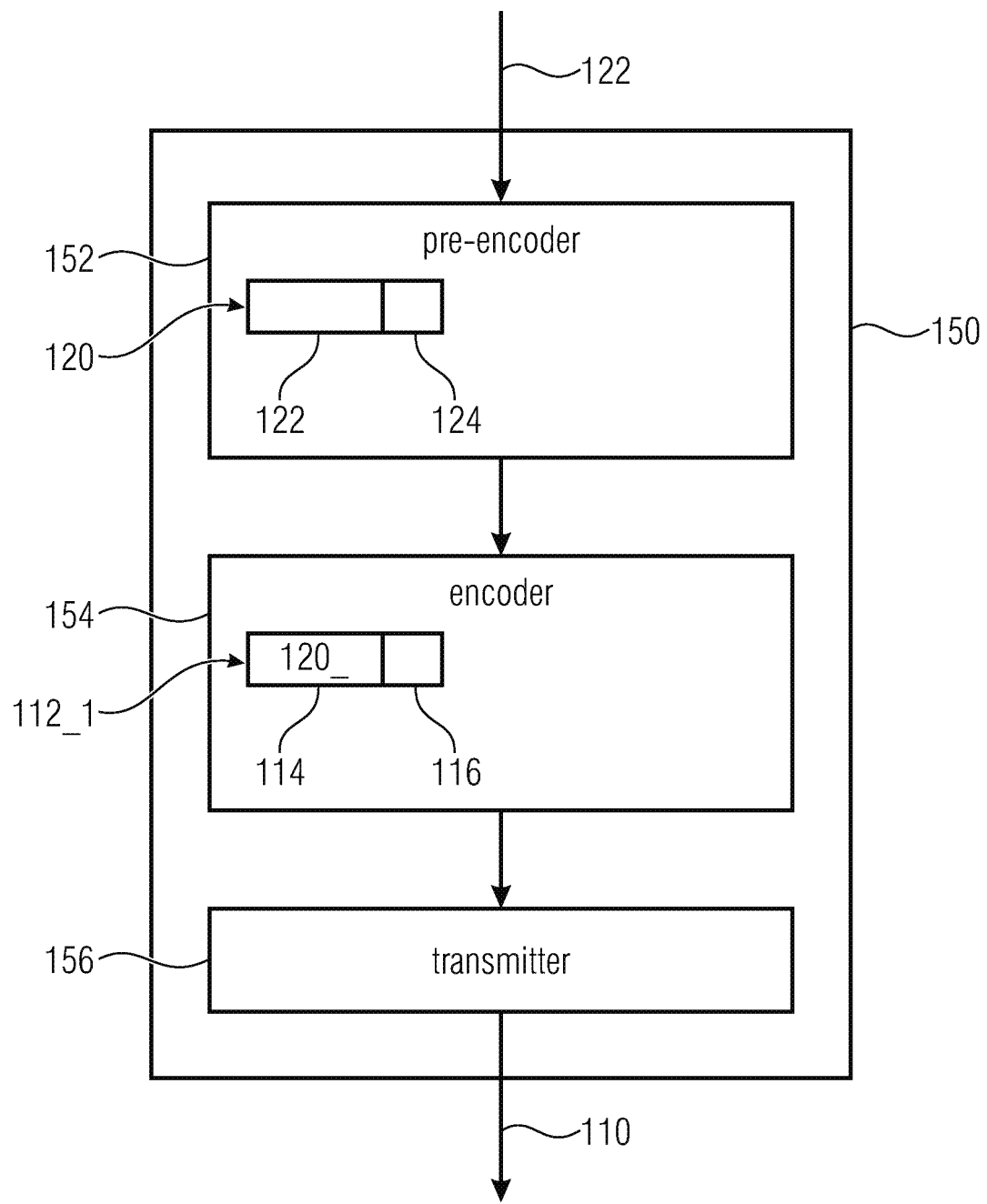
FIG. 3 shows a schematic block diagram of a satellite gateway, according to an embodiment of the present invention.

FIG. 3 shows a schematic block diagram of a satellite gateway 150. The satellite gateway 150 comprises a pre-encoder 152, an encoder 154 and a transmitter 156. The pre-encoder 152 is configured to encode payload data 122 to obtain error correcting data 124 for the payload data 122, and to provide a pre-encoded data packet 120 comprising the payload data 122 and the error correcting data 124 for the payload data 122. The encoder 154 is configured to encode the pre-encoded data packet 120 to obtain error correcting data 116 for the pre-encoded data packet 120, and to provide a data packet 112_1 comprising the pre-encoded data packet 120 as payload data 114 and the error correcting data 116 for the payload data 114. The transmitter 156 is configured to transmit an uplink data stream 110 comprising the data packet 112_1 to a satellite 100.

Figure 4:
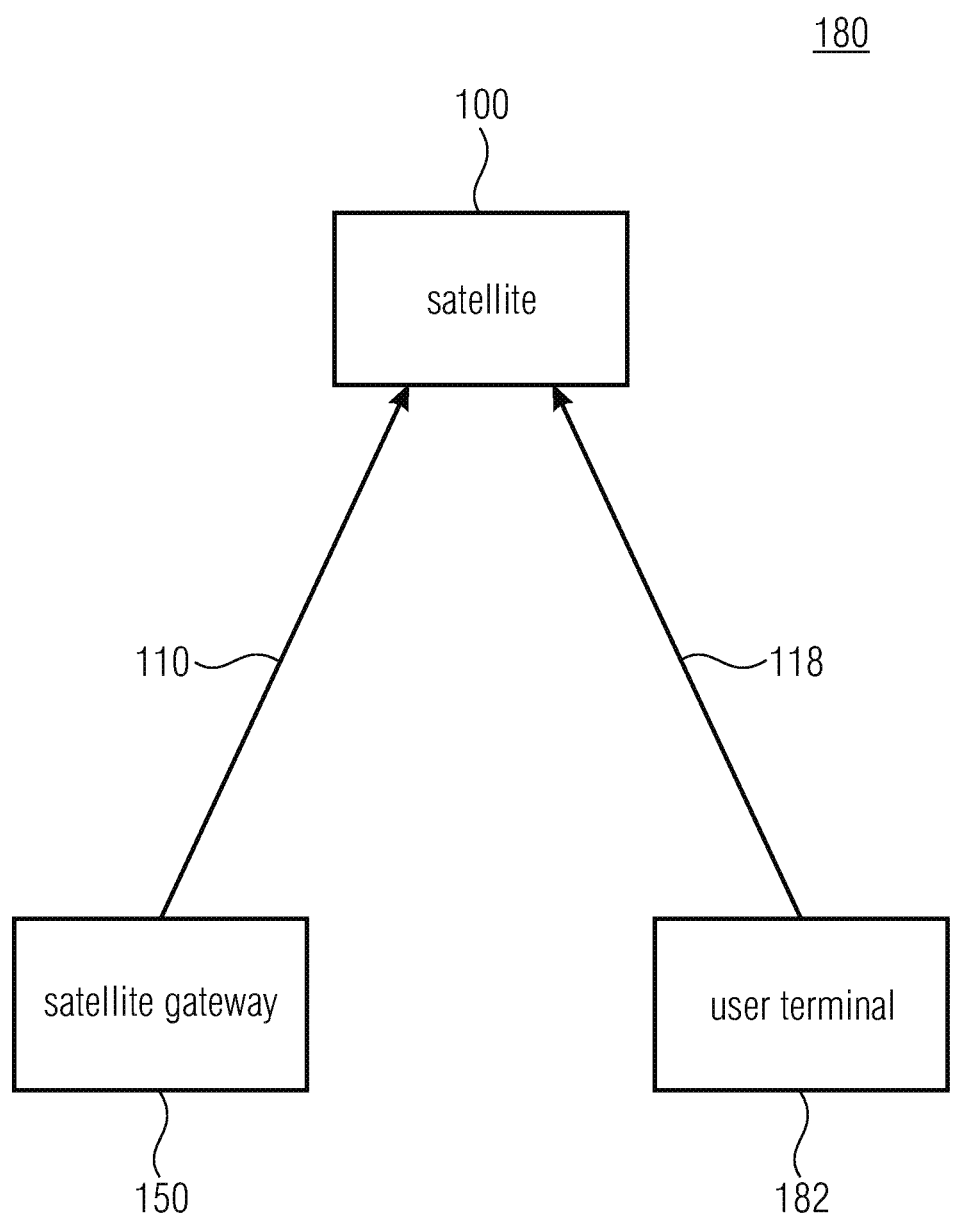
FIG. 4 shows a schematic block diagram of a satellite communication system, according to an embodiment.

FIG. 4 shows a schematic block diagram of a satellite communication system 180, according to an embodiment. The satellite communication system 180 can comprise a satellite gateway 150 and a satellite 100. Optionally, the satellite communication system 180 can comprise a user terminal 182. The uplink data stream 110 can be transmitted by the satellite gateway 150 to the satellite 100. The downlink data stream 118 can be transmitted by the satellite to the user terminal 182.

In embodiments, the satellite communication system 180 can comprise the satellite 100 with the transceiver 102 shown in FIG. 1 and a standard satellite gateway 150.

Further, the satellite communication system 180 can comprise the satellite 100 with the transceiver 102 shown in FIG. 2 and the satellite gateway 150 shown in FIG. 3.

In the following, a data transmission in a satellite communication system is described in further detail with respect to FIGS. 5 to 8.

Figure 5:
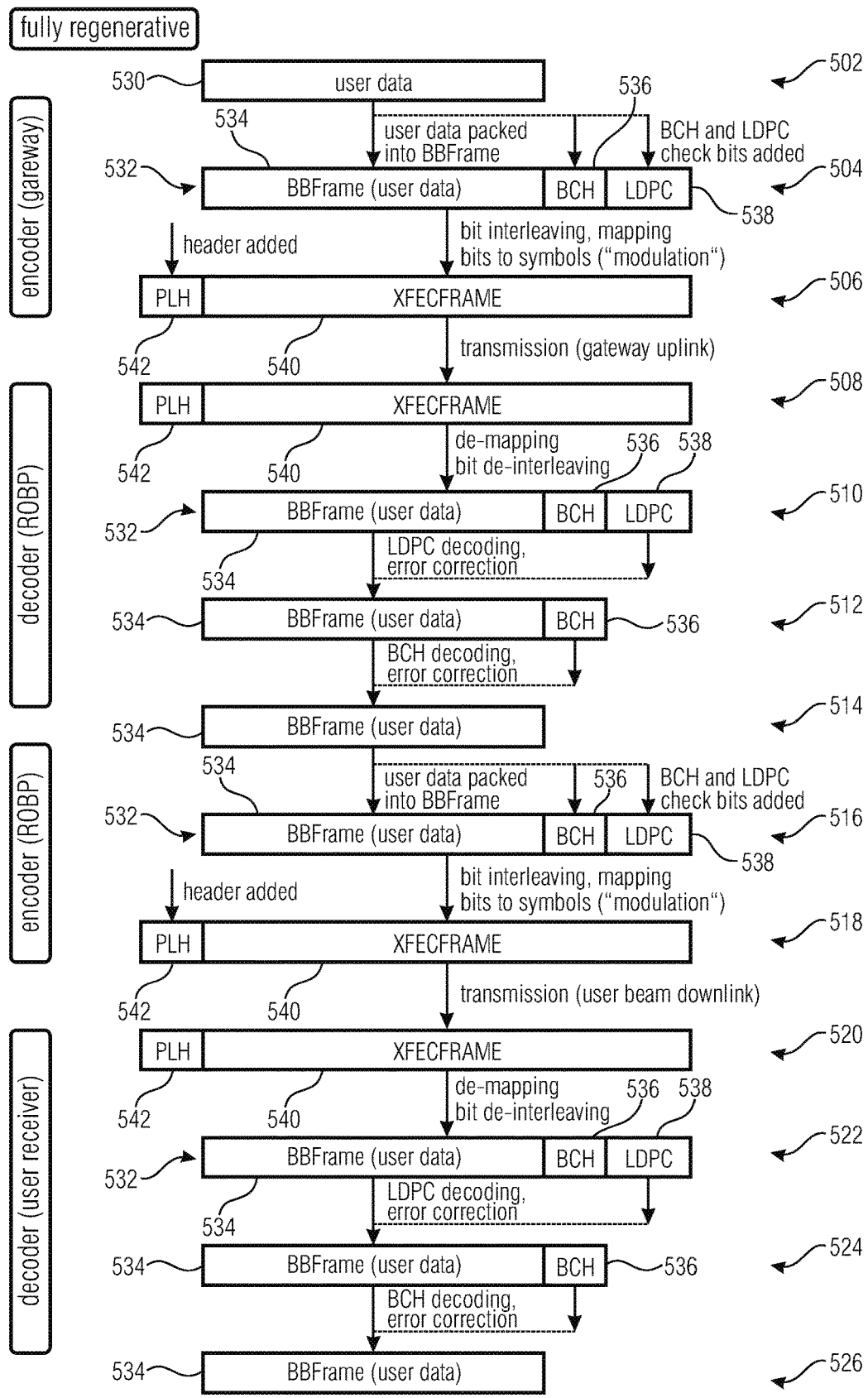
FIG. 5 shows a flowchart of data transmission method in a satellite communication system.

FIG. 5 shows a flowchart of a data transmission in a satellite communication system. The satellite communication system can be used, for example, to transmit DVB-S2 (DVB-S2=Digital Video Broadcasting-Satellite-Second Generation) encapsulated video data from a gateway to a set of user terminals (e.g. Direct-To-Home (DTH), satellite TV receivers) as an example.

Thereby, FIG. 5 illustrates a fully regenerative decoding and encoding process, where the steps "Decoder (ROBP)" and "Encoder (ROBP)" can be implemented in a regenerative on-board processor (ROBP) (or digital signal processor) as part of the satellite payload. After demodulating, de-mapping and de-interleaving the received signal, the error correction step (FEC decoding) can be twofold, first performing LDPC iterative decoding and error correction and second performing additional BCH decoding and error correction. The resulting packet ("BBFrame") is routed to the intended encoder and modulator (routing details not shown in FIG. 5). The encoder can calculate and append BCH and LDPC checksum information to the BBFrame (FEC encoding) and interleave the resulting bit stream. The modulator can insert header information, map the bit stream to symbols and apply pulse shape filtering.

As can be seen in FIG. 5, the signal and data format (PLH plus XFECFRAME) can be identical when transmitted by the gateway (up-link) and re-transmitted by the payload (down-link). In case of successful error correction also the content of the XFECFRAME transmitted by the gateway (up-link) and re-transmitted by the payload (down-link) is identical.

In detail, in FIG. 5, in a step 502, payload data (e.g., user data) 530 can be provided to an encoder of a satellite gateway. In a step 504, the encoder of the satellite gateway can packetize the payload data 530 into a data packet 532, e.g. into a BBFrame (BBFrame=Base Band Frame) 534 of the data packet 532. Further, BCH check bits 536 and LDPC check bits 538 can be added. In a step 506, the encoder of the satellite gateway can map the bits of the data packet 532 to symbols (modulation), to obtain a XFECFRAME (XFECFRAME=complex Forward Error Correction Frame) 540 to be transmitted (gateway uplink) as part of an uplink data stream to a satellite. Optionally, the encoder of the satellite gateway may perform bit interleaving before mapping the bits of the data packet 532 to the symbols. Further, a header (PLH=Physical Layer Header) 542 can be added.

In a step 508, the satellite can receive the uplink data stream with the XFECFRAME 540 and the header 542. In a step 510, the decoder (or digital signal processor) of the satellite can de-map (or demodulate) the XFECFRAME 540, to obtain the data packet 532 comprising the BBFrame 534 and the BCH check bits 536 and LDPC check bits 538. Optionally, the decoder (or digital signal processor) of the satellite can perform bit de-interleaving to obtain the data packet 532 comprising the BBFrame 534 and the BCH check bits 536 and LDPC check bits 538. In a step 512, the decoder (or digital signal processor) of the satellite can perform LDPC decoding and error correction using the LDPC check bits 538. In a step 514, the decoder (or digital signal processor) of the satellite can perform BCH decoding and error correction using the BCH check bits 536, to obtain an error corrected BBFrame 534.

In a step 516, the encoder (or digital signal processor) of the satellite can add BCH check bits 536 and LDPC check bits 538 to the BBFrame 534, to obtain a data packet 532. In a step 518, the encoder (or digital signal processor) of the satellite can map the bits of the data packet 532 to symbols (modulation), to obtain the XFECFRAME 540 to be transmitted (user beam downlink) as part of a downlink data stream to a user terminal. Optionally, the encoder of the satellite may perform bit interleaving before mapping the bits of the data packet 532 to the symbols. Further, a header (PLH) 542 can be added.

In a step 520, the decoder of the user terminal can receive the downlink data stream with the XFECFRAME 540 and the header 542. In a step 522, the decoder of the user terminal can de-map (demodulate) the XFECFRAME 540, to obtain the data packet 532 comprising the BBFrame 534 and the BCH check bits 536 and LDPC check bits 538. Optionally, the decoder of the user terminal can perform bit de-interleaving to obtain the data packet 532 comprising the BBFrame 534 and the BCH check bits 536 and LDPC check bits 538. In a step 524, the decoder of the user terminal can perform LDPC decoding and error correction using the LDPC check bits 538. In a step 526, the decoder of the user terminal can perform BCH decoding and error correction using the BCH check bits 536, to obtain an error corrected BBFrame 534.

Figure 6:
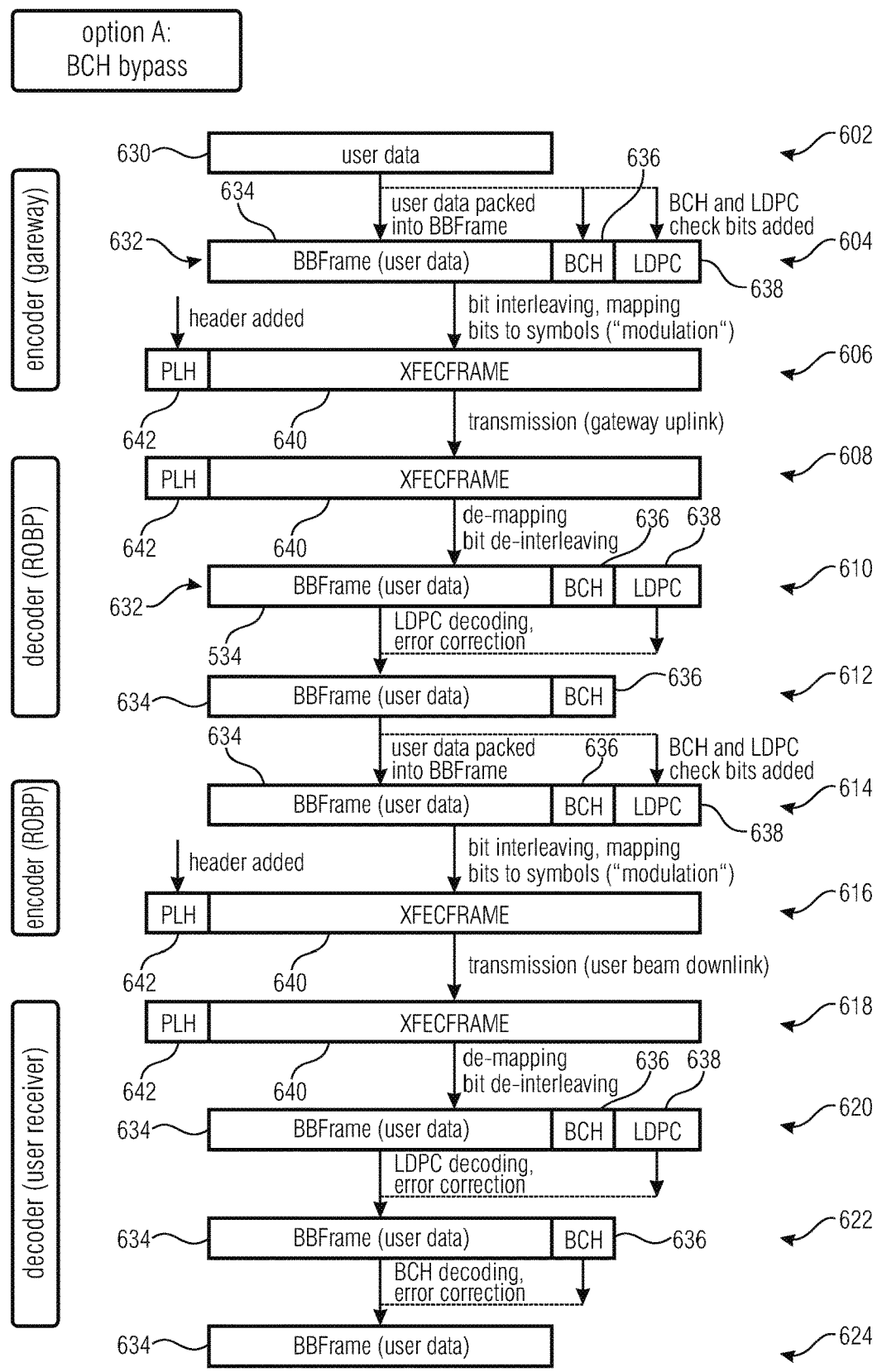
FIG. 6 shows a flowchart of data transmission method in a satellite communication system, according to a second embodiment.

FIG. 6 shows a flowchart of a data transmission in a satellite communication system, according to a second embodiment ("BCH Encoder Bypass"), in which processing resources are saved in the regenerative on-board processor (ROBP) (or digital signal processor). This embodiment skips the error correction using the BCH checksum and the calculation and appending of the BCH checksum information to the BBFrame.

In detail, in FIG. 6, in a step 602, payload data (e.g., user data) 630 can be provided to an encoder of a satellite gateway. In a step 604, the encoder of the satellite gateway can packetize the payload data 630 into a data packet 632, e.g. into a BBFrame 634 of the data packet 632. Further, BCH check bits 636 and LDPC check bits 638 can be added. In a step 606, the encoder of the satellite gateway can map the bits of the data packet 632 to symbols (modulation), to obtain a XFECFRAME 640 to be transmitted (gateway uplink) as part of an uplink data stream to a satellite. Optionally, the encoder of the satellite gateway may perform bit interleaving before mapping the bits of the data packet 632 to the symbols. Further, a header 642 can be added.

In a step 608, the satellite can receive the uplink data stream with the XFECFRAME 640 and the header 642. In a step 610, the decoder (or digital signal processor) of the satellite can de-map (or demodulate) the XFECFRAME 640, to obtain the data packet 632 comprising the BBFrame 634 and the BCH check bits 636 and LDPC check bits 638. Optionally, the decoder (or digital signal processor) of the satellite can perform bit de-interleaving to obtain the data packet 632 comprising the BBFrame 634 and the BCH check bits 636 and LDPC check bits 638. In a step 612, the decoder (or digital signal processor) of the satellite can only perform LDPC decoding and error correction only using the LDPC check bits 638.

In a step 614, the encoder (or digital signal processor) of the satellite can only add LDPC check bits 638 to the BBFrame 634 and the BCH check bits 636, to obtain a data packet 632 comprising the BBFrame 634, the (not used) BCH check bits 634 and the newly calculated LDPC check bits 638. In a step 616, the encoder (or digital signal processor) of the satellite can map the bits of the data packet 632 to symbols (modulation), to obtain the XFECFRAME 640 to be transmitted (user beam downlink) as part of a downlink data stream to a user terminal. Optionally, the encoder of the satellite may perform bit interleaving before mapping the bits of the data packet 632 to the symbols. Further, a header (PLH) 642 can be added.

In a step 618, the decoder of the user terminal can receive the downlink data stream with the XFECFRAME 640 and the header 642. In a step 620, the decoder of the user terminal can de-map (demodulate) the XFECFRAME 640, to obtain the data packet 632 comprising the BBFrame 634 and the BCH check bits 636 and LDPC check bits 638. Optionally, the decoder of the user terminal can perform bit de-interleaving to obtain the data packet 632 comprising the BBFrame 634 and the BCH check bits 636 and LDPC check bits 638. In a step 622, the decoder of the user terminal can perform LDPC decoding and error correction using the LDPC check bits 638. In a step 624, the decoder of the user terminal can perform BCH decoding and error correction using the BCH check bits 636, to obtain an error corrected BBFrame 634.

Figure 7A:
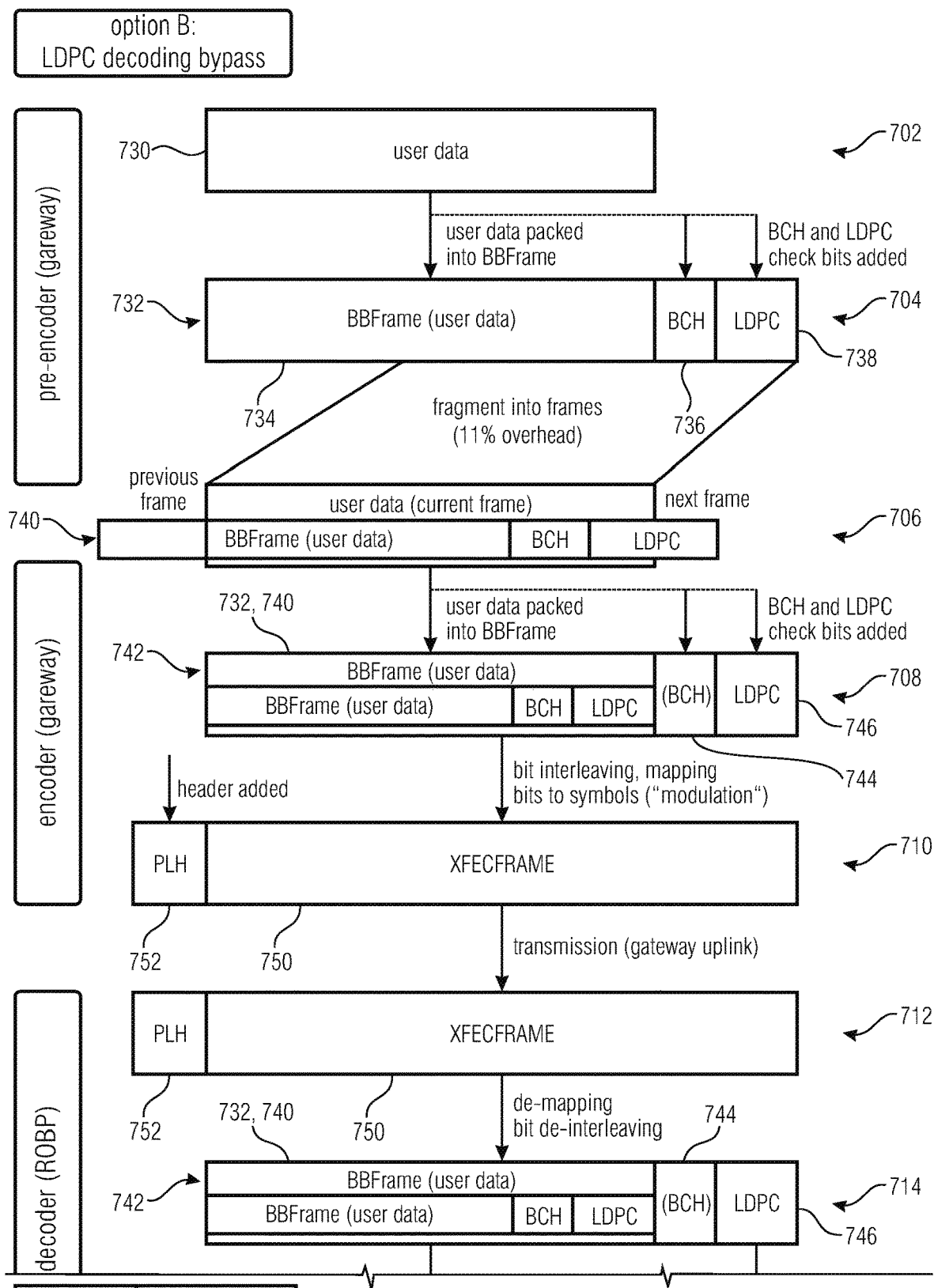

FIG. 7 shows a flowchart of a data transmission in a satellite communication system, according to a third embodiment ("FEC Encoder Bypass"), in which processing resources are saved in the regenerative on-board processor (ROBP) (or digital signal processor). This embodiment skips the calculation and appending of the BCH and LDPC checksum information to the BBFrame. The input to the encoder is a pre-encode bit stream, the encoder functionality is limited to interleaving the resulting bit stream, before the modulator inserts header information, maps the bit stream to symbols and applies pulse shape filtering.

Instead of encoding the bit stream in the regenerative on-board processor (ROBP), a pre-encoded bit stream is produced by an encoder in the gateway. This pre-encoded data is packetized into BBFrames. Each BBFrame is then again forward-error protected by a second gateway encoder and then modulated and transmitted on the gateway up-link.

The regenerative on-board processor (ROBP) receives, demodulates, de-maps and de-interleaves this up-link signal and applies error correction. The error correction step is again twofold, first performing LDPC iterative decoding and error correction and second performing BCH decoding and error correction. In case of successful error correction, a quasi-error free pre-encode bit stream is available at the "Decoder (ROBP)" output, and is identical to a bit stream that would have been produced by according to the standard process according to FIG. 5.

In detail, in FIG. 7, in a step 702 payload data (e.g., user data) 730 can be provided to a pre-encoder of a satellite gateway. In a step 704, the pre-encoder of the satellite gateway can packetize the payload data 730 into a data packet 732, e.g. into a BBFrame 734 of the data packet 732. Further, BCH check bits 736 and LDPC check bits 738 can be added, to obtain a pre-encoded data packet 732. Optionally, in a step 706, the pre-encoder of the satellite gateway can fragment the pre-encoded data packet 732 into frames, to obtain a pre-encoded data frame 740, e.g., with 11% overhead.

In a step 708 the encoder of the satellite gateway can add BCH check bits 744 and LDPC check bits 746 to the pre-encoded data packet (or the pre-encoded data frame 740), to obtain a data packet 742 having as payload data the pre-encoded data packet 732 (or the pre-encoded data frame 740). In a step 710, the encoder of the satellite gateway can map the bits of the data packet 742 to symbols (modulation), to obtain a XFECFRAME 750 to be transmitted (gateway uplink) as part of an uplink data stream to a satellite. Optionally, the encoder of the satellite gateway may perform bit interleaving before mapping the bits of the data frame 742 to the symbols. Further, a header 752 can be added.

In a step 712, the satellite can receive the uplink data stream with the XFECFRAME 750 and the header 752. In a step 714, the decoder (or digital signal processor) of the satellite can de-map (or demodulate) the XFECFRAME 750, to obtain the data packet 742 having as payload data the pre-encoded data packet 732 (or the pre-encoded data frame 740) and having the BCH check bits 744 and the LDPC check bits 746. Optionally, the decoder (or digital signal processor) of the satellite can perform bit de-interleaving to obtain the data packet 742. In a step 716, the decoder (or digital signal processor) of the satellite can perform LDPC decoding and error correction using the LDPC check bits 746. In a step 720, the decoder (or digital signal processor) of the satellite can perform BCH decoding and error correction using the BCH check bits 744, to obtain as error corrected payload data the pre-encoded data packet 732, having the BBFrame 734, the BCH check bits 736 and the LDPC check bits 738.

In a step 722, the modulator (or digital data stream processor) of the satellite can map the bits of the pre-encoded data packet 732 to symbols (modulation), to obtain the XFECFRAME 760 to be transmitted (user beam downlink) as part of a downlink data stream to a user terminal. Optionally, the modulator (or digital signal processor) of the satellite may perform bit interleaving before mapping the bits of the pre-encoded data packet 732 to the symbols. Further, a header (PLH) 762 can be added.

In a step 724, the decoder of the user terminal can receive the downlink data stream with the XFECFRAME 760 and the header 762. In a step 726, the decoder of the user terminal can de-map (demodulate) the XFECFRAME 760, to obtain the pre-encoded data packet 732 comprising the BBFrame 734 and the BCH check bits 736 and LDPC check bits 738. Optionally, the decoder of the user terminal can perform bit de-interleaving to obtain the pre-data packet 732 comprising the BBFrame 734 and the BCH check bits 736 and LDPC check bits 738. In a step 728, the decoder of the user terminal can perform LDPC decoding and error correction using the LDPC check bits 738. In a step 730, the decoder of the user terminal can perform BCH decoding and error correction using the BCH check bits 736, to obtain an error corrected BBFrame 734.

Figure 8:
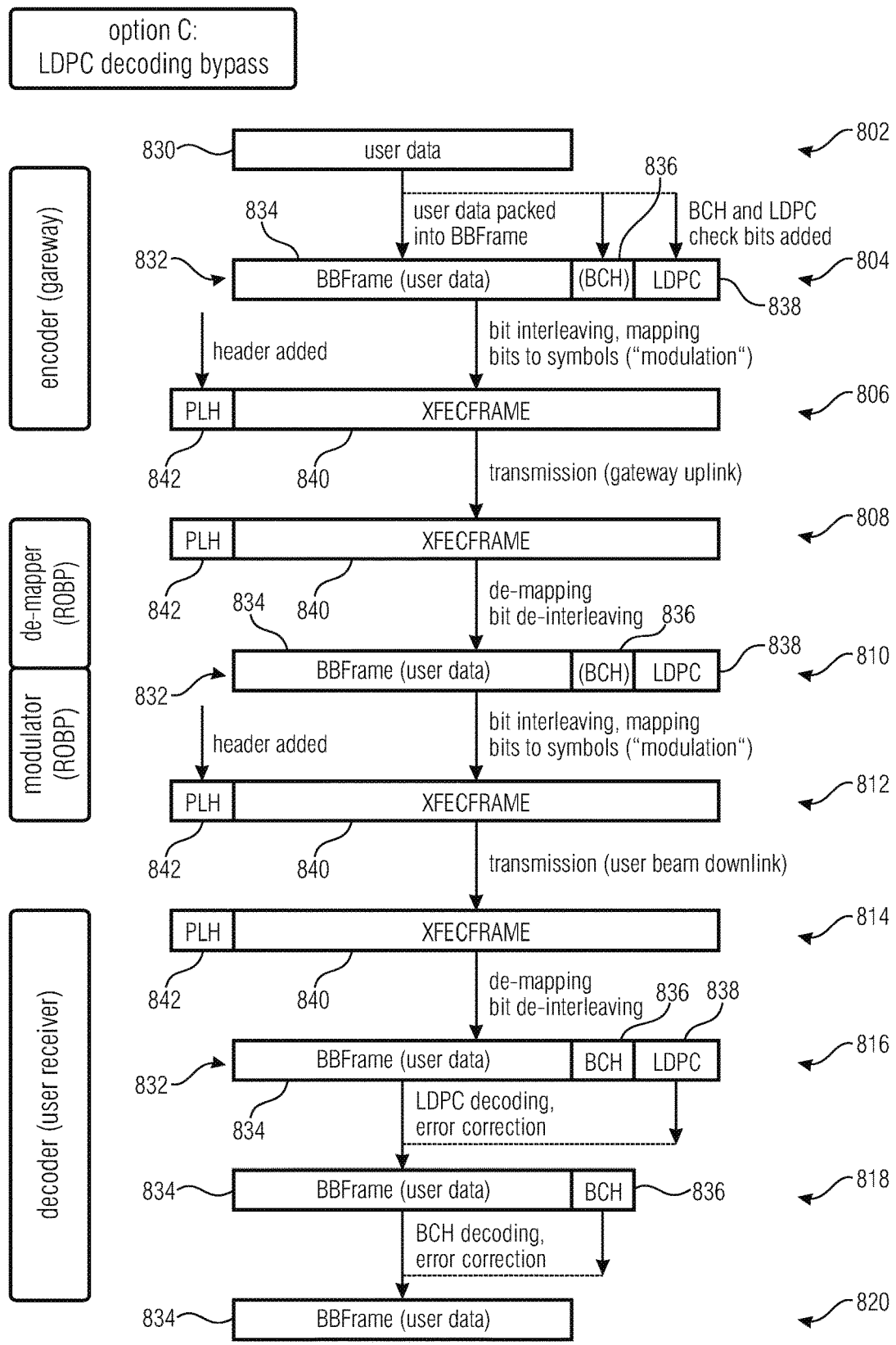
FIG. 8 shows a flowchart of data transmission method in a satellite communication system, according to a fourth embodiment.

FIG. 8 shows a flowchart of a data transmission in a satellite communication system, according to a fourth embodiment, in which processing resources are saved in the regenerative on-board processor (ROBP) (or digital signal processor). This embodiment skips decoding and error correction and the subsequent calculation and appending of the BCH and LDPC checksum information to the BBFrame altogether. The input to the encoder is the (still error protected) output of the de-mapping process; the encoder functionality is limited to inserting header information, mapping the bit stream to symbols and applying pulse shape filtering.

It should be noted that this embodiment still provides end-to-end error protection, however with encoding and error protection solely applied in gateway and decoding and error correction solely applied in the user terminal. The de-mapping and (hard) decision process in the regenerative on-board processor (ROBP) may cause bit errors in the resulting bit stream. The modulator will map this (potentially erroneous) bit stream to the nominal constellation points, according to the modulation scheme used on the user down-link. Except such bit errors resulting from the (hard) decision process, noise and interference impairments from the up-link signal will not propagate into the down-link signal.

In detail, in FIG. 8, in a first step 802, payload data (e.g., user data) 830 can be provided to an encoder of a satellite gateway. In a step 804, the encoder of the satellite gateway can packetize the payload data 830 into a data packet 832, e.g. into a BBFrame (BBFrame=Base Band Frame) 834 of the data packet 832. Further, BCH check bits 836 and LDPC check bits 838 can be added. In a step 806, the encoder of the satellite gateway can map the bits of the data packet 832 to symbols (modulation), to obtain a XFECFRAME 840 to be transmitted (gateway uplink) as part of an uplink data stream to a satellite. Optionally, the encoder of the satellite gateway may perform bit interleaving before mapping the bits of the data packet 832 to the symbols. Further, a header (PLH) 842 can be added.

In a step 808, the satellite can receive the uplink data stream with the XFECFRAME 840 and the header 842. In a step 810, the de-mapper (or digital signal processor) of the satellite can de-map (or demodulate) the XFECFRAME 840, to obtain the data packet 832 comprising the BBFrame 834 and the BCH check bits 836 and LDPC check bits 838. Optionally, the de-mapper (or digital signal processor) of the satellite can perform bit de-interleaving to obtain the data packet 832 comprising the BBFrame 834 and the BCH check bits 836 and LDPC check bits 838.

In a step 812, the modulator (or digital signal processor) of the satellite can map the bits of the data packet 832 to symbols (modulation), to obtain the XFECFRAME 840 to be transmitted (user beam downlink) as part of a downlink data stream to a user terminal. Optionally, the modulator (or digital signal processor) of the satellite may perform bit interleaving before mapping the bits of the data packet 834 to the symbols. Further, a header (PLH) 842 can be added.

In a step 814, the decoder of the user terminal can receive the downlink data stream with the XFECFRAME 840 and the header 842. In a step 816, the decoder of the user terminal can de-map (demodulate) the XFECFRAME 840, to obtain the data packet 832 comprising the BBFrame 834 and the BCH check bits 836 and LDPC check bits 838. Optionally, the decoder of the user terminal can perform bit de-interleaving to obtain the data packet 832 comprising the BBFrame 834 and the BCH check bits 836 and LDPC check bits 838. In a step 818, the decoder of the user terminal can perform LDPC decoding and error correction using the LDPC check bits 838. In a step 820, the decoder of the user terminal can perform BCH decoding and error correction using the BCH check bits 836, to obtain an error corrected BBFrame 834.

The fourth embodiment ("FEC Encoder Bypass") shown in FIG. 8 provides significant reductions in the encoder by skipping the LDPC and BCH encoding steps. Resources savings are both in terms of logic gates (ASIC) or look-up tables (FPGA) and in memory needed for the encoding and buffering process. Using a DVB-S2 encoder as an example, an estimated 50% of the logic resources and an estimated 70% of memory blocks can be saved while the number of involved multipliers (DSP units) remains the same. Skipping the LDPC and BCH encoding step furthermore increases the options for pipelining the remaining data path design, resulting in overall increased throughput and/or reducing the power consumption in the encoder.

The actual LDPC and BCH encoders and the framing logic can be implemented as part of the gateway system, and by transmitting a pre-encode bit stream on the up-link, while the functionality of the regenerative on-board processor (ROBP) (or digital data stream processor) is limited to mapping, symbol generation and pulse shape filtering. This allows for changes (functional and performance improvements, implementation of future standard formats) in the FEC encoding and the pre-encoded bit stream format by modifying only the ground systems, and without affecting the regenerative on-board processor (ROBP).

Figure 9:
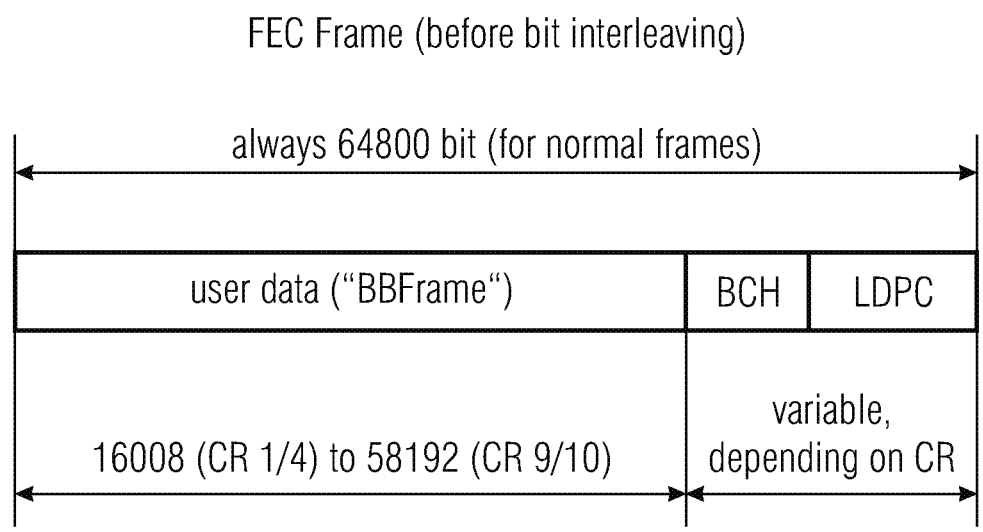
FIG. 9 shows a schematic view of a data packet used for transmitting payload in a satellite communication system.

Transmitting a pre-encoded bit stream on the up-link results in additional data overhead, as the pre-encoded bit stream contains checksum information. Assuming normal DVB-S2 frames, this encoded data is 64,800 bit, representing between 16,008 and 58,192 user data bits as shown in FIG. 9. However, to support maximum throughput on the user downlink the code rate 9/10 needs to be considered (and the uplink needs to be capable of supporting this capacity). For this code rate, the overhead is only approx. 11%. This overhead can be easily accommodated on the gateway up-link, usually having a much better link budget (higher carrier to noise and interference ratio) and capacity than the user down-link.

Due to the higher carrier to noise and interference ratio on the up-link, the uplink can be operated at higher order modulation, e.g. 16APSK (4 Bit per symbol) or 32APSK (5 Bit per symbol) compared to QPSK (2 Bit per symbol) or 8PSK (3 Bit per symbol) on the user down-link. The up-link modulation scheme is solely handled by the ROBP de-modulator and de-mapper, while the down-link modulation scheme is solely handled by the ROBP modulator (bit to symbol mapping and pulse shape filter). Both processes are fully decoupled and independent from the FEC scheme.

In the third embodiment ("FEC Encoder Bypass") shown in FIG. 7, the ROBP decoder still implements LDPC and BCH decoding and error correction for the signal received on the gateway up-link, providing, as long as the uplink carrier to noise and interference ratio is above the decoding threshold, a quasi-error free bit stream at the output. This quasi-error free bit stream itself is pre-encoded (i.e. LDPC and BCH protected) data. The user terminal implements LDPC and BCH decoding and error correction for the signal received on the user down-link, again providing, as long as the uplink carrier to noise and interference ratio is above the decoding threshold, a quasi-error free bit stream (e.g. a video transport stream) at the output. Therefore, noise and interference impairments are fully decoupled between gateway up- and user down-link and are not additive as in a standard "bent pipe"-type payload, resulting in increased end-to-end link and system capacity.

The fourth embodiment ("Decoder and Encoder Bypass" or "End-To-End FEC Protection") shown in FIG. 8 provides additional reductions in the decoder by skipping the LDPC and BCH decoding and error correcting steps. This processing is typical dominant in terms of resources for the overall decoder. Especially when assuming use of wide-band carriers (500 MHz) on the up-link, higher order modulation and with FEC processing on all incoming data, the FEC related functionality in the decoder may use estimated 80% to 90% of the logic gates (ASIC) or look-up tables (FPGA), estimated 75% of the memory blocks and estimated 60% of the multipliers (DSP units).

As the LDPC and BCH decoding is skipped in the decoder, also the de-mapping process is simplified, no longer needing "soft output" information as LDPC decoder input. While use of hard decision de-mapping is more efficient in terms of resources, it is also known to result in an additional implementation loss. Such implementation loss shifts the decoding threshold, entailing a higher carrier to noise and interference ratio on the gateway up-link for quasi-error free de-mapping compared to a decoder implementing LDPC and BCH decoding and error correction. This higher carrier to noise and interference ratio can be achieved by proportionally increasing the carrier power on the gateways side. Assuming the gateway implements uplink power control (UPC) for rain fade mitigation, increasing the nominal carrier power will result in a reduced UPC range and thus reduced rain fade margin. Consequentially, the probability of a rain fade exceeding the UPC range increases and communication drop-outs become more likely.

Figure 10:
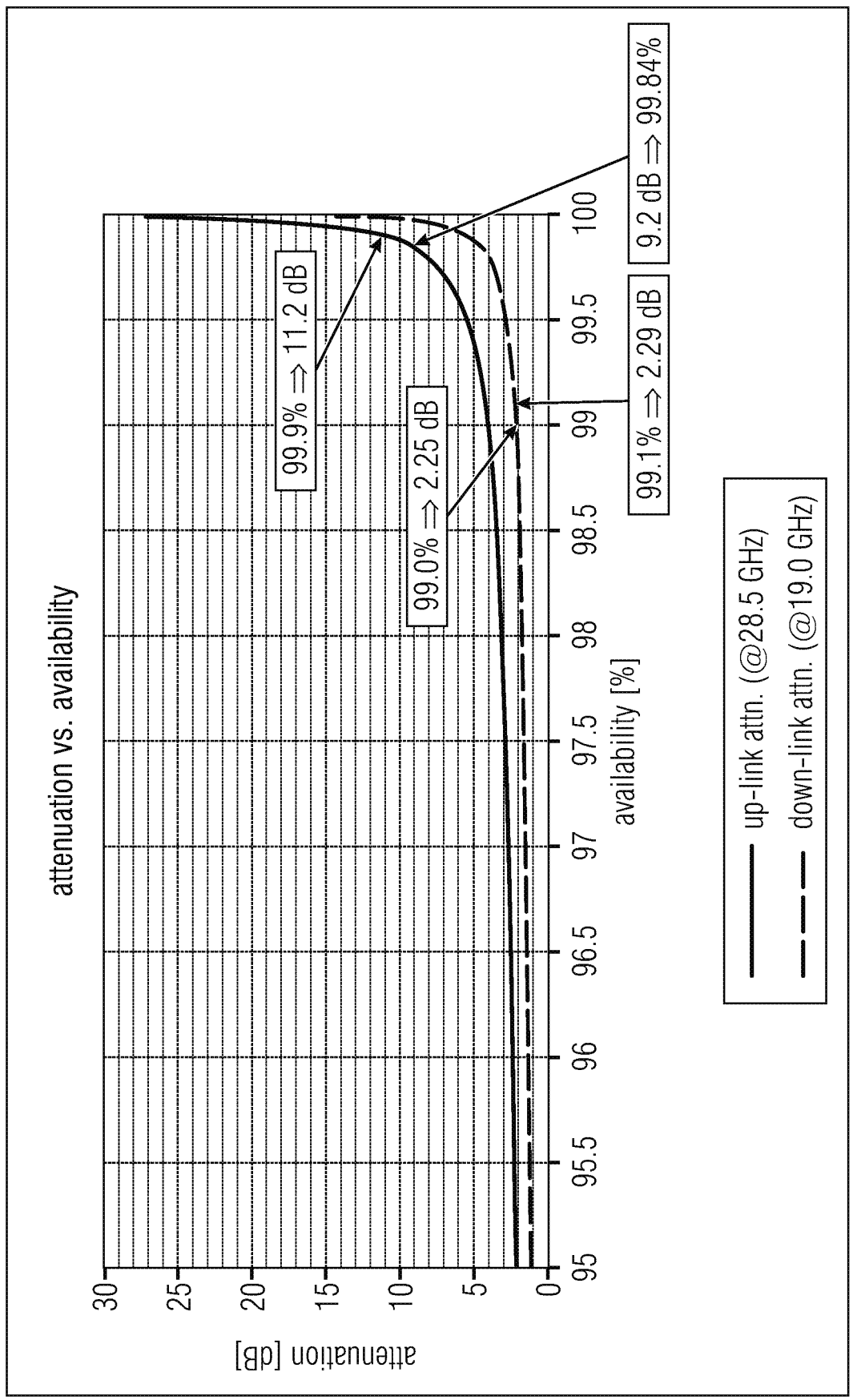
FIG. 10 shows in a diagram an uplink attenuation and a downlink attenuation plotted over an availability of the communication link.

FIG. 10 shows an example of a typical "rain fade (or total atmospheric) attenuation" vs. "communication link availability" plot. Usually the gateway up-link is operated with significant rain fade margin, resulting in high availability (e.g. 99.9%). Assuming an implementation loss of 2 dB reduces the fade margin by the same 2 dB; this consequentially reduces the link availability (e.g. from 99.9% to 99.84%). On the other hand, the user down-link is operated at lower frequency and with reduced fade margin, e.g. targeting only 99.0% availability. If the gateway and user site are distant from each other, fade events are largely independent and availability numbers multiply, providing end-to-end availablity. Due to the differences between gateway up- and user down-link, the end-to-end availability changes only from 98.90% (no implementation loss) to 98.84% (2 dB implementation loss on the gateway up-link). Furthermore, the implementation loss on the up-link can be easily mitigated by slightly increasing (by less than 0.1 dB in the example) the power on the user down-link.

In this fourth embodiment ("Decoder and Encoder Bypass" or "End-To-End FEC Protection") shown in FIG. 8, there is still end-to-end error protection (in the gateway) and error correction (in the user terminal). Bit errors may be introduced by the ROBP due to hard decision de-mapping when operating the gateway up-link at or near the decoding threshold. Depending on the number of bit errors and the quality of the user down-link, LDCP and BCH decoding and error correction in the user terminal may still be able to recover a quasi-error free stream. Noise and interference impairments are largely decoupled between gateway up- and user down-link and typically not additive as in a standard "bent pipe"-type payload, resulting in extra end-to-end capacity.

Figure 11:
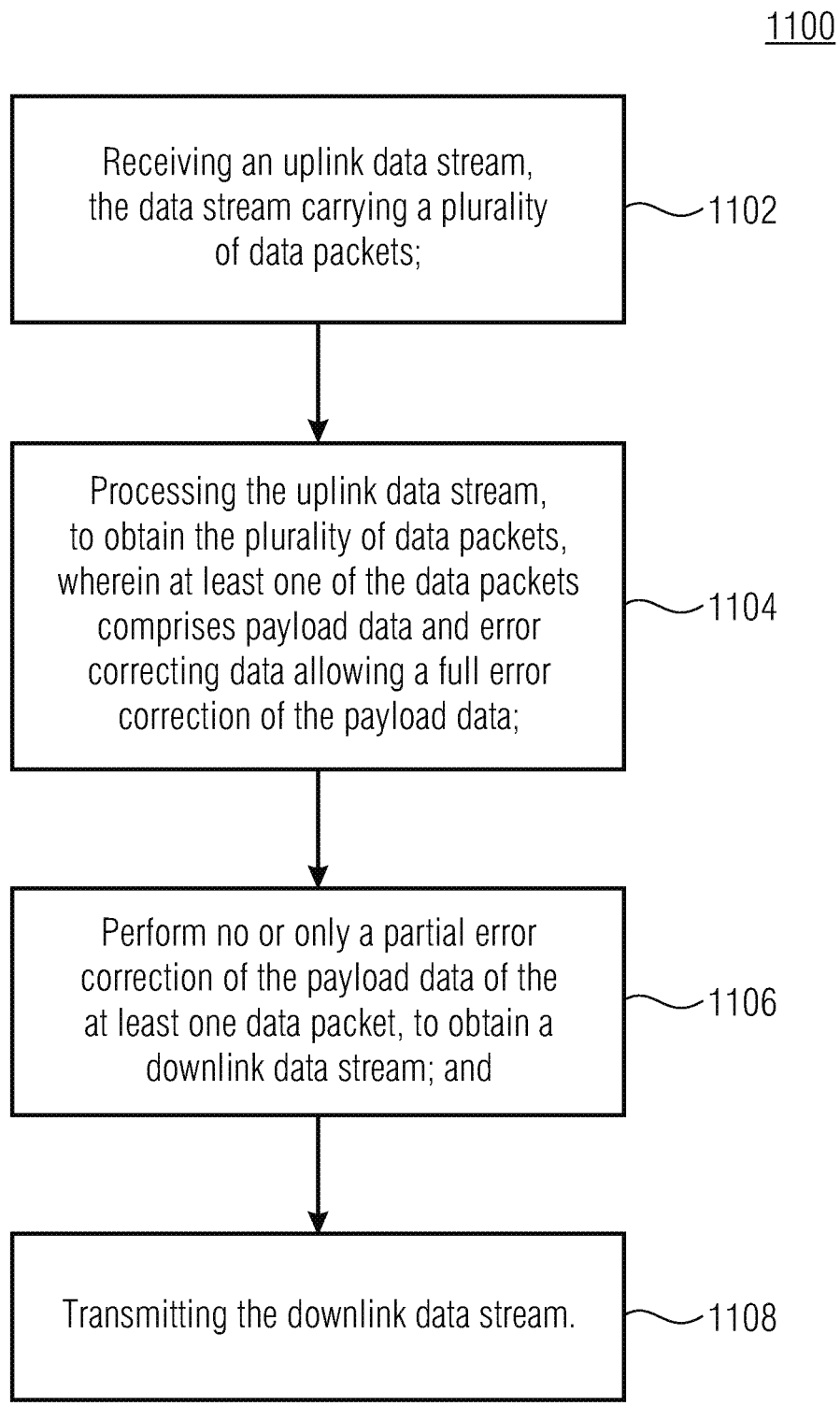
FIG. 11 shows a flowchart of a method for receiving and re-transmitting data in a satellite, according to an embodiment.

FIG. 11 shows a flowchart of a method 1100 for receiving and re-transmitting data in a satellite. The method 1100 comprises a step 1102 of receiving an uplink data stream, the data stream carrying a plurality of data packets. Further, the method 1100 comprises a step 1104 of processing the uplink data stream, to obtain the plurality of data packets, wherein at least one of the data packets comprises payload data and error correcting data allowing a full error correction of the payload data. Further, the method 1100 comprises a step 1106 of performing no or only a partial error correction of the payload data of the at least one data packet, to obtain a downlink data stream. Further, the method 1100 comprises a step 1108 of transmitting the downlink data stream.

Figure 12:
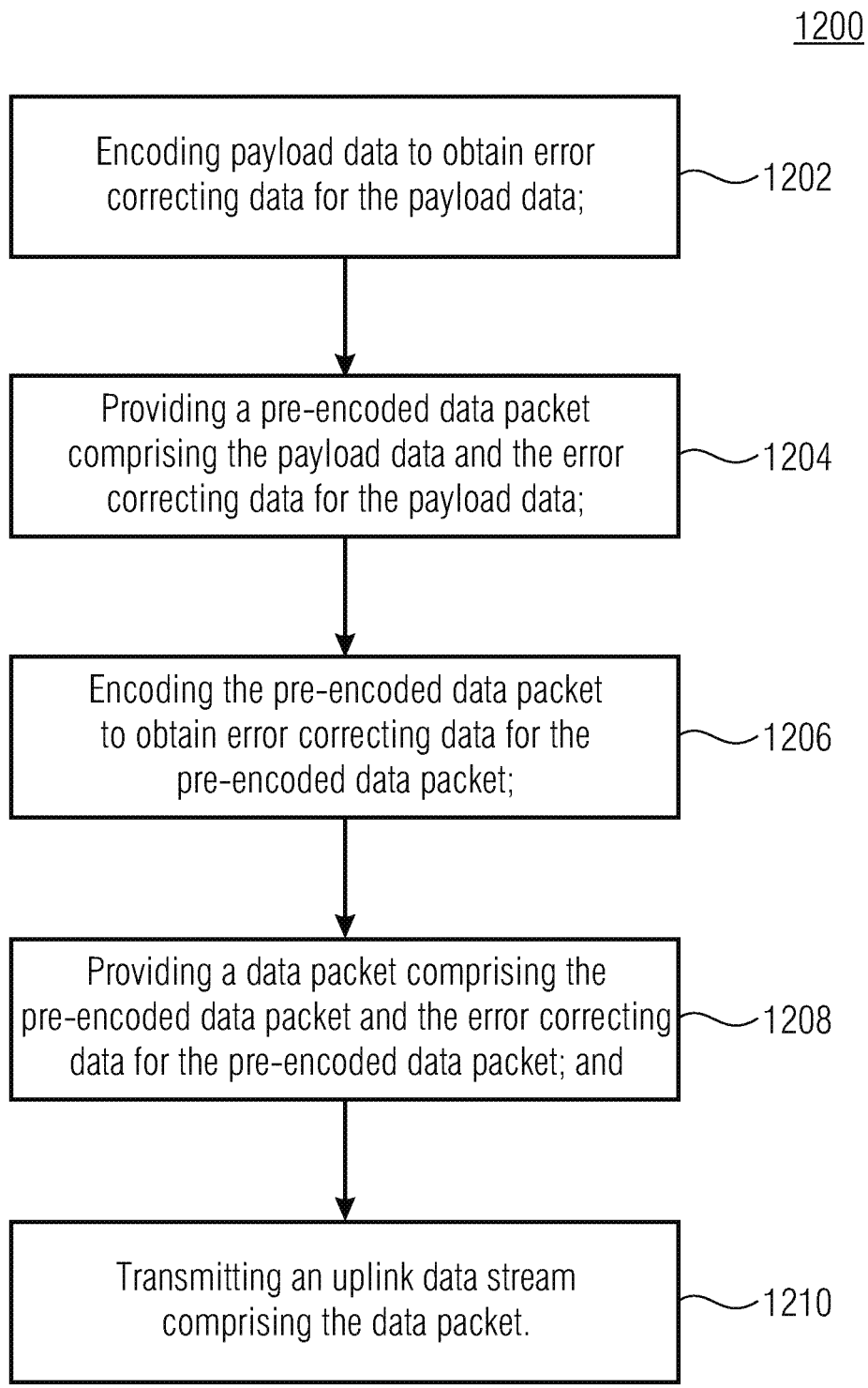
FIG. 12 shows a flowchart of a method for transmitting in a satellite gateway, according to an embodiment.

FIG. 12 shows a flowchart of a method 1200 for transmitting in a satellite gateway. The method 1200 comprises a step 1202 of encoding payload data to obtain error correcting data for the payload data. Further, the method 1200 comprises a step 1204 of providing a pre-encoded data packet comprising the payload data and the error correcting data for the payload data. Further, the method 1200 comprises a step 1206 of encoding the pre-encoded data packet to obtain error correcting data for the pre-encoded data packet. Further, the method 1200 comprises a step 1208 of providing a data packet comprising the pre-encoded data packet and the error correcting data for the pre-encoded data packet. Further, the method 1200 comprises a step 1210 of transmitting an uplink data stream comprising the data packet.

Figure 13:
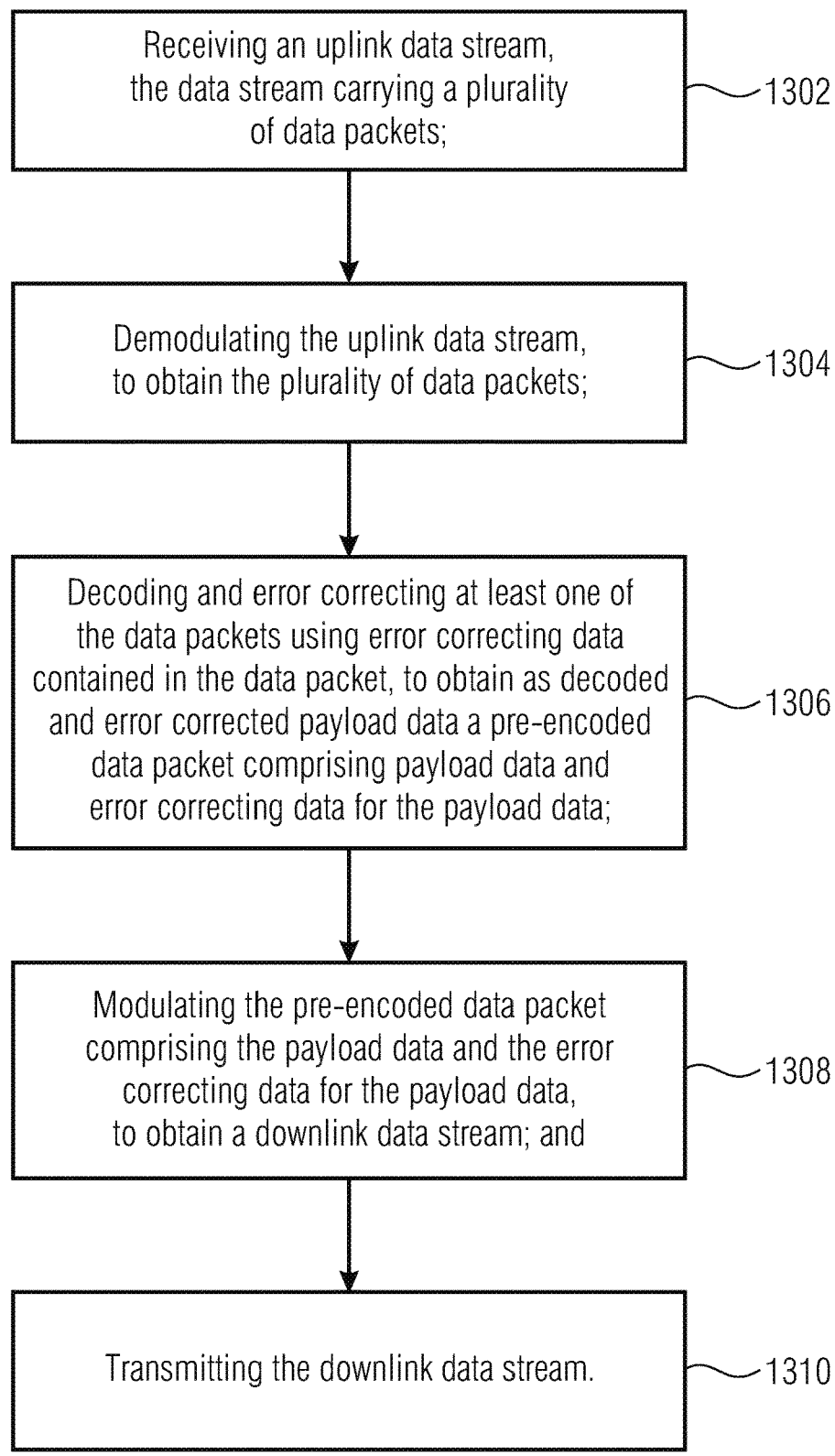
FIG. 13 shows a flowchart of a method for receiving and re-transmitting data in a satellite, according to an embodiment.

FIG. 13 shows a flowchart of a method 1300 for receiving and re-transmitting data in a satellite. The method 1300 comprises a step 1302 of receiving an uplink data stream, the data stream carrying a plurality of data packets. Further, the method 1300 comprises a step 1304 of demodulating the uplink data stream, to obtain the plurality of data packets. Further, the method 1300 comprises a step 1306 of decoding and error correcting at least one of the data packets using error correcting data contained in the data packet, to obtain as decoded and error corrected payload data a pre-encoded data packet comprising payload data and error correcting data for the payload data. Further, the method 1300 comprises a step 1308 of modulating the pre-encoded data packet comprising the payload data and the error correcting data for the payload data, to obtain a downlink data stream. Further, the method 1300 comprises a step 1310 of transmitting the downlink data stream.

Figure 14:
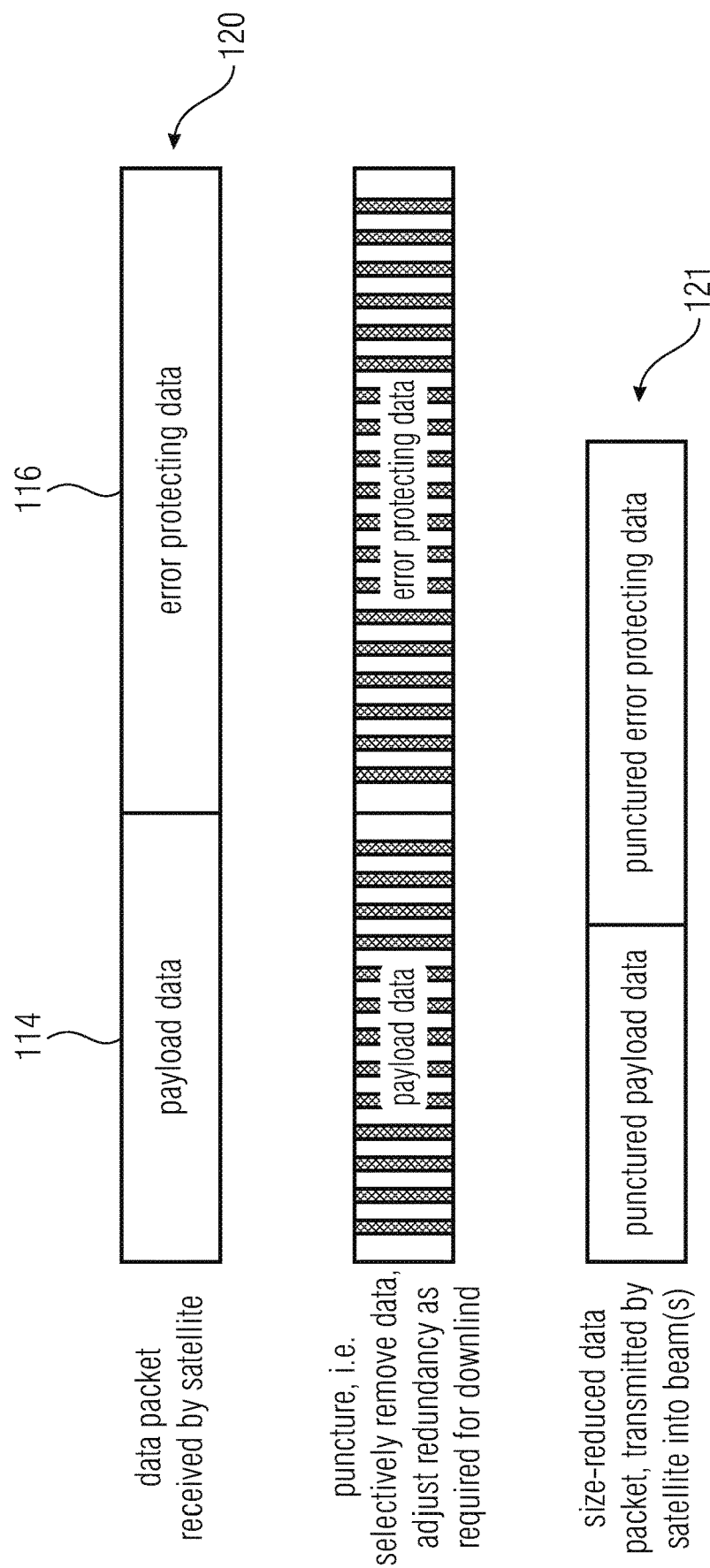
FIG. 14 shows a schematic view of a data packet before and after modifying a code rate by means of puncturing.

FIG. 14 shows a schematic view of a data packet before and after modifying a size thereof by means of puncturing, e.g., performed by the digital data stream processor of the transceiver (of the satellite). As already mentioned, the data packet can comprise payload data 114 and error correcting data 116. As shown in FIG. 14, puncturing (i.e. selectively removing data, adjust redundancy as needed for downlink) can be applied to both, payload data 114 and error correcting data 116, to obtain a data packet 121 that is reduced in size.

Embodiments can be used, for example, in uni-directional satellite communication, e.g. direct-to-home (DTH) TV broadcasting using a satellite.

Embodiments can be used, for example, in bi-directional satellite communication, e.g. satellite broadband (internet access) or other data communication using satellite.

Although above embodiments were described, in which satellite with the transceiver is used for receiving data from a satellite gateway and (optionally) for transmitting data to a user terminal, it is pointed out that the satellite with the transceiver is not limited to such embodiments. Rather, the satellite with the transceiver also can be used in inter-satellite systems, i.e., for receiving data from another satellite and/or for transmitting data to another satellite.

Although above embodiments were described in which the transceiver 102 is used for receiving and transmitting data in a satellite, it is noted that the transceiver 102 is not limited to such embodiments. Rather, the transceiver also can be used in other wireless communication systems, such as meshed networks (sensor networks, Wifi networks using repeaters, multi-hop internet-of-things or car-to-car communication, military meshed or beyond line-of-sight communication).

In other words, embodiments extend to other communication systems, for example, characterized by using at least one repeater (i.e. multi-hop), with this repeater advantageously being resource (size, power, processing, memory) constraint. Examples include meshed networks (sensor networks, Wifi networks using repeaters, multi-hop internet-of-things or car-to-car communication, military meshed or beyond line-of-sight communication).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein.

The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A satellite gateway, comprising:
a pre-encoder, configured to encode payload data to acquire error correcting data for the payload data, and to provide a pre-encoded data packet comprising the payload data and the error correcting data for the payload data;
an encoder configured to encode the pre-encoded data packet to acquire error correcting data for the pre-encoded data packet, and to provide a data packet comprising the pre-encoded data packet as payload data and the error correcting data for the pre-encoded data packet; and
a transmitter, configured to transmit an uplink data stream comprising the data packet to a satellite.

2. The satellite gateway according to claim 1, wherein the pre-encoder is configured to encode the payload data twice using two different error correcting codes, to acquire the error correcting data for the payload data, the error correcting data comprising two different error correcting code words corresponding to the two different error correcting codes.

3. The satellite gateway according to claim 2, wherein the encoder is configured to encode the pre-encoded data packet twice using two different error correcting codes, to acquire the error protecting data for the pre-encoded data packet, the error protecting data comprising two different error correcting code words corresponding to the two different error correcting codes.

4. A satellite, comprising:
a receiver configured to receive an uplink data stream, the data stream carrying a plurality of data packets;
a digital data stream processor, configured to demodulate the uplink data stream, to acquire the plurality of data packets, wherein the data stream processor is configured to decode and error correct at least one of the data packets using error correcting data comprised in the data packet, to acquire as decoded and error corrected payload data a pre-encoded data packet comprising payload data and error correcting data for the payload data;
wherein the digital data stream processor is configured to modulate the pre-encoded data packet comprising the payload data and the error correcting data for the payload data, to acquire a downlink data stream; and
at least one transmitter configured to transmit the downlink data stream.

5. The satellite according to claim 4, wherein the digital data stream processor is configured to leave the payload data and the error correcting data for the payload data of the pre-encoded data packet unaltered, such that the downlink data stream comprises the pre-encoded data packet with the payload data and the error correcting data as decoded and error corrected.

6. The satellite according to claim 5, wherein the digital data stream processor is configured to modify the at least one of the pre-encoded data packets, to acquire a modified version of the at least one of the data packets, and to provide the downlink data stream comprising the modified version of the at least one of the data packets.

7. The satellite according to claim 4, wherein the digital data stream processor is configured to perform a two-stage decoding and error correction of the at least one of the data packets using the error correcting data comprised in the data packet to acquire as the decoded and error corrected payload data the pre-encoded data packet, the error correcting data comprising two different code words corresponding to two different error correcting codes.

8. A system, comprising:
a satellite gateway according to claim 1; and
a satellite according to claim 4.

9. An inter-satellite system, comprising:
two satellites according to claims 1 and 5.

10. A transceiver, comprising
a receiver configured to receive an uplink data stream, the data stream carrying a plurality of data packets;
a digital data stream processor, configured to demodulate the uplink data stream, to acquire the plurality of data packets, wherein the data stream processor is configured to decode and error correct at least one of the data packets using error correcting data comprised in the data packet, to acquire as decoded and error corrected payload data a pre-encoded data packet comprising payload data and error correcting data for the payload data;
wherein the digital data stream processor is configured to modulate the prem encoded data packet comprising the payload data and the error correcting data for the payload data, to acquire a downlink data stream; and
at least one transmitter configured to transmit the downlink data stream.

11. Method, comprising:
encoding payload data to acquire error correcting data for the payload data;
providing a pre-encoded data packet comprising the payload data and the error correcting data for the payload data;
encoding the pre-encoded data packet to acquire error correcting data for the pre-encoded data packet;
providing a data packet comprising the pre-encoded data packet and the error correcting data for the pre-encoded data packet; and
transmitting an uplink data stream comprising the data packet.

12. Method, comprising:
receiving, by a receiver, an uplink data stream, the data stream carrying a plurality of data packets;
demodulating, by a digital data stream processor, the uplink data stream, to acquire the plurality of data packets;
decoding and error correcting, by the digital data stream processor, at least one of the data packets using error correcting data comprised in the data packet, to acquire as decoded and error corrected payload data a pre-encoded data packet comprising payload data and error correcting data for the payload data;
modulating, by the digital data stream processor, the pre-encoded data packet comprising the payload data and the error correcting data for the payload data, to acquire a downlink data stream; and
transmitting, by a transmitter, the downlink data stream.

13. A non-transitory digital storage medium having a computer program stored thereon to perform the method, the method, comprising:
encoding payload data to acquire error correcting data for the payload data;
providing a pre-encoded data packet comprising the payload data and the error correcting data for the payload data;
encoding the pre-encoded data packet to acquire error correcting data for the pre-encoded data packet;

providing a data packet comprising the pre-encoded data packet and the error correcting data for the pre-encoded data packet; and transmitting an uplink data stream comprising the data packet, when said computer program is run by a computer.

14. A non-transitory digital storage medium having a computer program stored thereon to perform the method, the method comprising:

receiving an uplink data stream, the data stream carrying a plurality of data packets;

demodulating the uplink data stream, to acquire the plurality of data packets;

decoding and error correcting at least one of the data packets using error correcting data comprised in the data packet, to acquire as decoded and error corrected payload data a pre-encoded data packet comprising payload data and error correcting data for the payload data;

modulating the pre-encoded data packet comprising the payload data and the error correcting data for the payload data, to acquire a downlink data stream; and transmitting the downlink data stream, when said computer program is run by a computer.

* * * * *

UNITED STATES PATENT AND TRADEMARK OFFICE
CERTIFICATE OF CORRECTION

PATENT NO. : 10,790,931 B2  
APPLICATION NO. : 15/690847  
DATED : September 29, 2020  
INVENTOR(S) : Frank Mayer et al.

It is certified that error appears in the above-identified patent and that said Letters Patent is hereby corrected as shown below:

In the Claims

Claim 3, Column 23, Line 23 should read as:     The satellite gateway according to claim 1, Claim 9, Column 24, Line 8 should read as:     . . .two satellites according to claim 5.

Claim 10, Column 24, Line 23 should read as:     . . .modulate the pre-encoded data. . .

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*